(12) United States Patent
Nishizono

(10) Patent No.: US 6,788,152 B2
(45) Date of Patent: Sep. 7, 2004

(54) AMPLIFICATION CIRCUIT AND OPTICAL COMMUNICATION APPARATUS PROVIDED WITH THE AMPLIFICATION CIRCUIT

(75) Inventor: Kazunori Nishizono, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/418,174

(22) Filed: Apr. 18, 2003

(65) Prior Publication Data

US 2003/0197563 A1 Oct. 23, 2003

(30) Foreign Application Priority Data

Apr. 19, 2002 (JP) ........................................ 2002-118233

(51) Int. Cl.[7] .............................. H03F 3/08; H03G 3/10; H01J 40/14
(52) U.S. Cl. ........................ 330/308; 330/278; 330/285; 250/214 A
(58) Field of Search ................................. 330/308, 278, 330/285; 250/214 A, 214 AG

(56) References Cited

U.S. PATENT DOCUMENTS 5,483,200 A * 1/1996 Okabayashi et al. ......... 330/308
5,821,814 A * 10/1998 Katayama et al. ........... 330/277
5,838,807 A * 11/1998 Andersson et al. .......... 381/321

FOREIGN PATENT DOCUMENTS

| JP | 8-172332 | 7/1996 |
|---|---|---|
| JP | 2001-127560 | 5/2001 |
| JP | 2001-211035 | 8/2001 |

OTHER PUBLICATIONS

US 2002/0044020 A1 of Umeda et al.*

* cited by examiner

Primary Examiner—Patricia Nguyen
(74) Attorney, Agent, or Firm—Armstrong, Kratz, Quintos, Hanson & Brooks, LLP

(57) ABSTRACT

An amplification circuit used in an optical communication apparatus includes a first amplifier for generating a first voltage signal corresponding to an input current, a second amplifier for amplifying the first voltage signal and generating a second voltage signal, a gain control circuit for generating a gain control signal for adjusting the gain of the first amplifier based on the second voltage signal, and a bias control circuit for generating a bias control signal for adjusting the bias current at the output of the first amplifier based on the gain control signal. The bias control signal stabilizes the bias voltage of the first amplifier during gain adjustment of the first amplifier.

26 Claims, 20 Drawing Sheets

AMPLIFICATION CIRCUIT AND OPTICAL COMMUNICATION APPARATUS PROVIDED WITH THE AMPLIFICATION CIRCUIT

CROSS-REFERENCE TO RELATED APPLICATIONS

This application is based upon and claims the benefit of priority from prior Japanese Patent Application No. 2002-118233, filed on Apr. 19, 2002, the entire contents of which are incorporated herein by reference.

BACKGROUND OF THE INVENTION

The present invention relates to an amplification circuit, and more specifically relates to an amplification circuit provided in an optical communication apparatus.

In recent years, electronic devices such as portable telephones, and portable terminals such as personal digital assistants (PDAs) have been provided with infrared data communication functions. Computers have been provided with optical communication apparatuses for sending and receiving data over optical fiber. These optical communication apparatuses include an amplification circuit as an optical receiver amplifier (amp).

As shown in FIG. 1, a first example of a conventional optical receiver amp 10 is connected to a photodiode PD. The photodiode PD generates a reception current IPD corresponding to the amount of light received, and the optical receiver amp 10 generates a reception signal RX in accordance with the reception current IPD. The optical receiver amp 10 includes a pre-amp 11, a main amp 12, and a comparator 13.

The pre-amp 11 includes a resistor R1 connected between an operating power supply VREG and the photodiode PD, and a diode D1 connected in parallel with the resistor R1. The diode D1 is connected to the resistor R1 in the forward direction relative to the current flowing through the resistor R1. The pre-amp 11 converts the reception current IPD to a voltage signal VFM. The amount of change $\Delta$VFM of the voltage signal VFM relative to the amount of change $\Delta$IPD of the reception current IPD is represented by the expression $\Delta$VFM=$\Delta$IPD×R1. The operating power supply VREG may supplied through a power supply filter provided internally or externally to an integrated circuit (IC) built into the receiver amp 10, or may be supplied from a constant-voltage regulated power supply.

The main amp 12 amplifies the voltage signal VFM, and generates an amplification signal VA. The comparator 13 converts the amplification signal VA of the main amp 12 to a digital reception signal RX using a threshold voltage VTH.

An optical receiver amp 20 of a second conventional example is a differential-type amp, as shown in FIG. 2, and includes a pre-amp 21, a buffer circuit 22, a bandpass filter 23, a main amp 24, a comparator 25, and a DC light-canceling circuit 26.

The pre-amp 21 includes two resistors R2 and R3, four transistors Q1 through Q4, and two current sources 27 and 28, and generates a differential output signal. The resistor R2, transistor Q1 and current source 27 are connected in series between an operating power supply VREG and a low-potential power supply, and the resistor R3, transistor Q2 and current source 28 are connected in series between the operating power supply VREG and the low-potential power supply. A bias voltage VB is supplied to the bases of the transistors Q1 and Q2. A photodiode PD is connected at a node between the transistor Q1 and the current source 27.

The emitter of the transistor Q3 is connected between the resistor R2 and the transistor Q1, and the emitter of the transistor Q4 is connected at the node between the resistor R3 and the transistor Q2. A high-potential power supply Vcc supplies power to the collectors of the transistors Q3 and Q4, and a clamp voltage Vc is applied to the bases of the transistors Q3 and Q4.

The pre-amp 21 generates a main voltage signal VFM at a node between the resistor R2 and the transistor Q1, and generates a reference voltage signal VFP at a node between the resistor R3 and the transistor Q2.

When a reception current is not generated by the photodiode PD, the clamp voltage Vc, and base-emitter voltage VBE of the transistors Q3 and Q4, and the voltage signal VFM have the relationship VC−VBE>VFM, and the transistors Q3 and Q4 are turned OFF. The transistors Q3 and Q4 are turned ON when a relatively large input current is supplied, and the voltage signals VFM and VFP are clamped at predetermined voltages.

The amount of change $\Delta$VFM in the voltage signal VFM relative to the amount of change $\Delta$IPD in the reception current IPD is represented by the expression $\Delta$VFM=$\Delta$IPD× R2. The buffer circuit 22, the bandpass filter 23, and the main amp 24 amplify the differential voltage $\Delta$VF ($\Delta$VPF− $\Delta$VFM) of the differential output signal of the pre-amp 21, and generate an amplified differential output signal. The comparator 25 converts the differential output signal from the main amp 24 to a digital reception signal RX.

The DC light-canceling circuit 26 cancels the direct current component (DC component) included in the reception current IPD flowing through the photodiode PD. The DC component is generated by background DC light, such as sunlight and the like, and includes a frequency component lower than the predetermined frequency band including the communication frequency. The DC light-canceling circuit 26 provides feedback for the current canceling the canceled DC component, which is included in the voltage signals VFM and VFP, to the input of the pre-amp 21.

When light input to the photodiode PD includes light components other than communication light, the total gain of the optical receiver amps 10 and 20 is reduced, and the signal-to-noise (S/N) ratio of the optical receiver amps must be increased. Generally, an auto gain control (AGC) circuit is used as a means of reducing the gain. A more effective method of simply reducing the gain is to adjust the resistance value of the resistor R1 (resistors R2 and R3 of pre-amp 21) of the pre-amp 11 via an AGC circuit. However, when the resistance values of these resistors R1 through R3 are adjusted, the bias voltage fluctuates in conjunction with the variation in the resistance values. Then, a suitable bias voltage is not supplied to later-stage amps. Particularly when the optical receiver amps 10 and 20 are operated by a low voltage power supply, there is not enough margin in the bias level between amps.

When the resistance values of the resistors R1, R2, and R3 are adjusted by an AGC circuit, the amount of attenuation (amount of change in the gain) is approximately −30 dB$\Omega$. When the optical input signal is relatively large, the gain must be reduced, which naturally requires another circuit. However, adding this circuit increases the circuit area of the optical receiver amp.

SUMMARY OF THE INVENTION

In a first aspect of the present invention, an amplification circuit for receiving an input current is provided. The amplification circuit includes a first amplifier including a current-to-voltage conversion resistor for generating a first voltage signal corresponding to the input current. A second amplifier is connected to the first amplifier to amplify the first voltage signal and generating a second voltage signal. A first gain control circuit is connected to the first and second amplifiers to generate a first gain control signal based on the second voltage signal and adjusting the resistance value of the current-to-voltage conversion resistor in accordance with the first gain control signal. A bias control circuit is connected to the first amplifier and the first gain control circuit to generate a bias control signal based on the gain control signal and adjust the bias current at the output of the first amplifier in accordance with the bias control signal.

In a second aspect of the present invention, an optical communication apparatus for receiving signal light is provided. The optical communication apparatus includes a first photoreceptor element for receiving the signal light and generating a first reception current. A first amplifier is connected to the first photoreceptor element and includes a current-to-voltage conversion resistor. The first amplifier generates a first voltage signal corresponding to the first reception current. A second amplifier is connected to the first amplifier to amplify the first voltage signal and generating a second voltage signal. A first gain control circuit is connected to the first and second amplifiers to generate a first gain control signal based on the second voltage signal and adjust the resistance value of the current-to-voltage conversion resistor in accordance with the first gain control signal. A bias control circuit is connected to the first amplifier and the first gain control circuit to generate a bias control signal based on the gain control signal and adjusting the bias current at the output of the first amplifier in accordance with the bias control signal.

In a third aspect of the present invention, there is provided an optical communication apparatus which includes a transmission circuit for generating a transmission current in accordance with a transmission signal, a light-emitting element for generating transmission signal light in accordance with the transmission current and generating a signal light detection signal, a photoreceptor element for receiving a signal light and generating a reception current, a reception circuit connected to the photoreceptor element for generating a reception signal corresponding to the reception current. A switching circuit is connected to the light-emitting element, the transmission circuit and the reception circuit, to connect the light-emitting element and the transmission circuit in a transmission mode and connect the light-emitting element and the reception circuit in a reception mode. The reception circuit includes a first amplifier including a current-to-voltage conversion resistor for generating a first voltage signal corresponding to the reception current. A second amplifier is connected to the first amplifier to amplify the first voltage signal and generating a second voltage signal. A first gain control circuit is connected to the first and second amplifiers to generate a first gain control signal based on the second voltage signal and adjusting the resistance value of the current-to-voltage conversion resistor in accordance with the first gain control signal. A bias control circuit is connected to the first amplifier and the first gain control circuit to generate a bias control signal based on the gain control signal and adjust the current at the output of the first amplifier in accordance with the bias control signal. A second gain control circuit is connected to the light-emitting element and the first amplifier to generate a second gain control signal based on the detection signal and adjust the gain of the first amplifier in accordance with the second gain control signal.

Other aspects and advantages of the invention will become apparent from the following description, taken in conjunction with the accompanying drawings, illustrated by way of examples of the principles of the invention.

BRIEF DESCRIPTION OF THE DRAWINGS

The invention, together with objects and advantages thereof, may best be understood by reference to the following description of the presently preferred embodiments together with the accompanying drawings, in which.

DETAILED DESCRIPTION OF THE PREFERRED EMBODIMENTS

Figure 1:
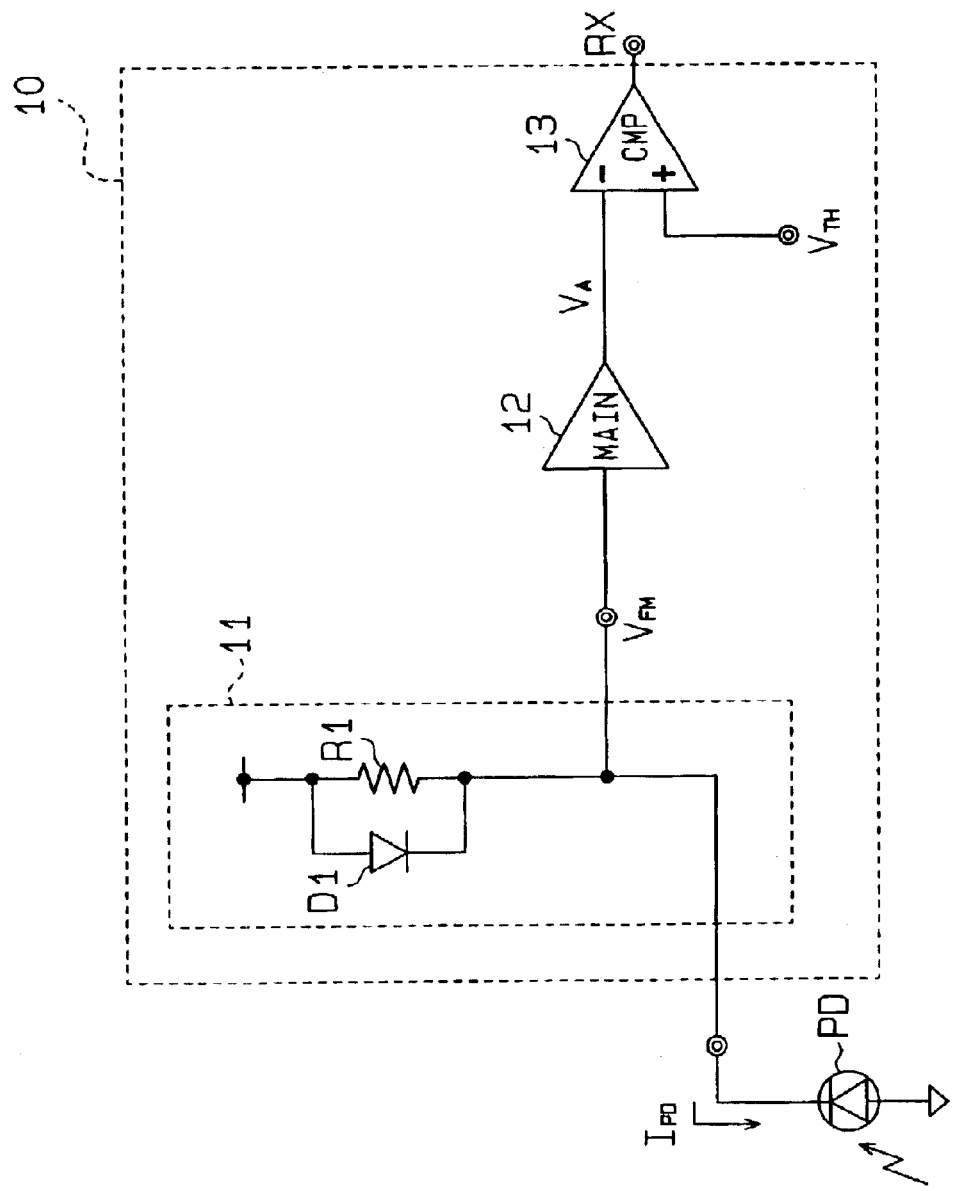
FIG. 1 is a circuit diagram of a first example of a conventional optical receiver amp.
Figure 2:
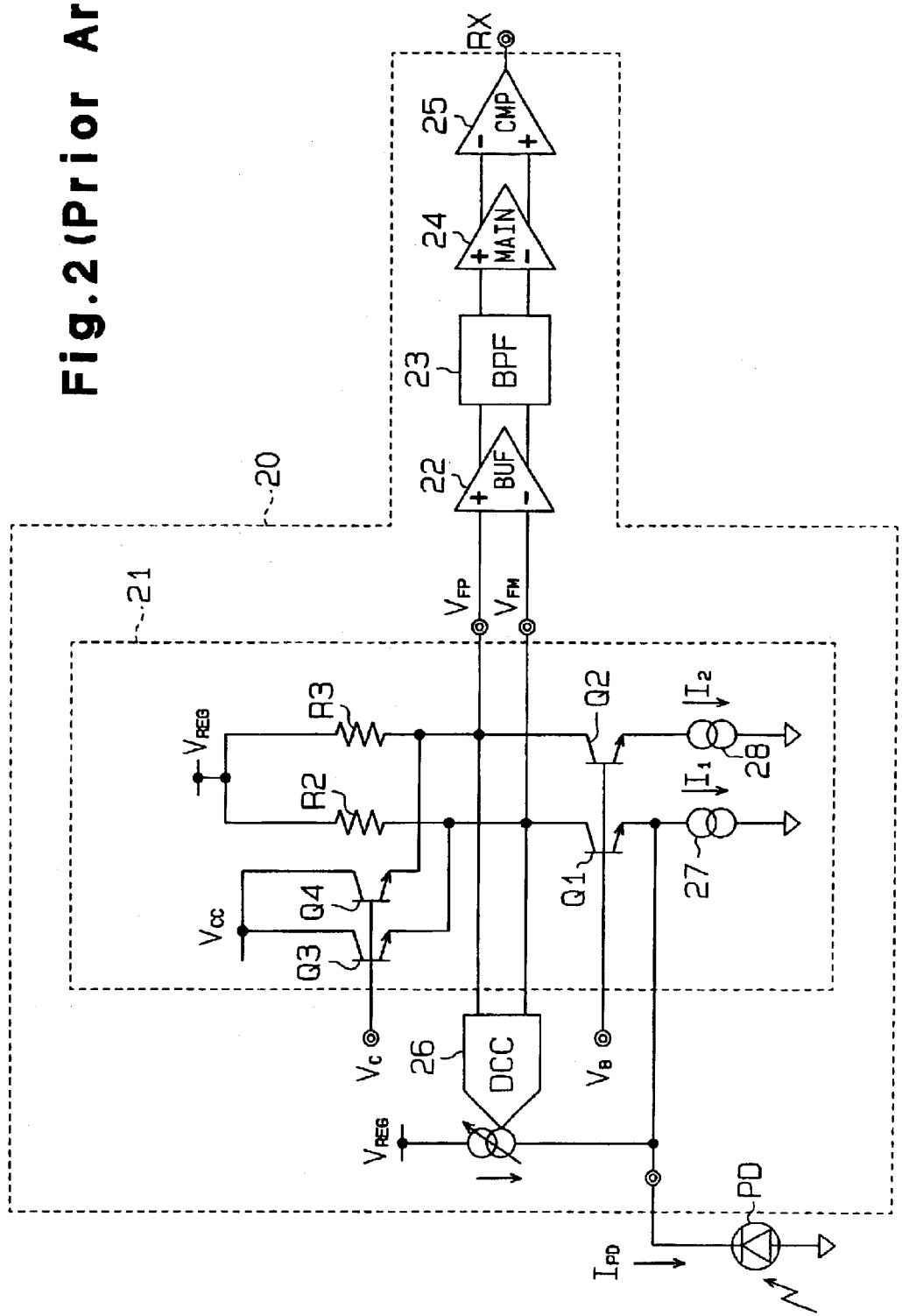
FIG. 2 is a circuit diagram of a second example of a conventional optical receiver amp.

In the drawings, like numerals are used for like elements throughout.

Figure 6:
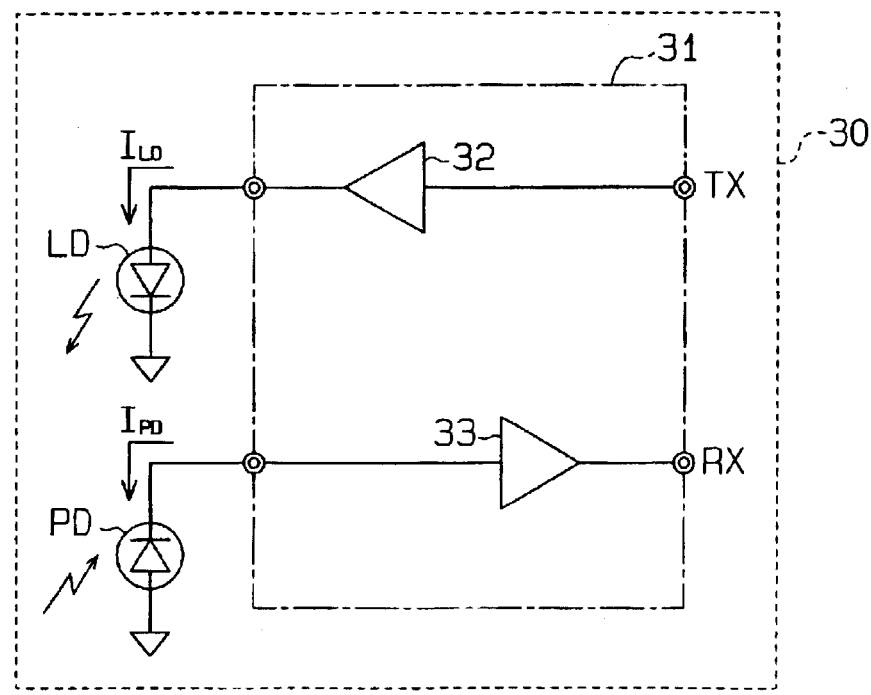
FIG. 6 is a schematic circuit diagram of an optical communication apparatus including the optical receiver amp of FIG. 3.

As shown in FIG. 6, an optical communication apparatus 30 of a first embodiment of the present invention includes a light-emitting diode LD, a photodiode PD, and a transmission-reception circuit 31. The transmission-reception circuit 31 includes an optical transmitter amp 32 as an amplification circuit and transmission circuit, and an optical receiver amp 33 as an amplification circuit and a reception circuit.

The optical transmitter amp 32 receives a transmission signal TX and supplies a pulse-like transmission current ILD corresponding to the transmission signal TX to the light-emitting diode LD. The optical transmitter amp 32 repeatedly emits and quenches in accordance with the transmission current ILD.

The photodiode PD generates a reception current IPD corresponding to the reception light. The optical receiver amp 33 converts the reception current IPD of the photodiode PD to a voltage (I-to-V) to generate a reception voltage, and generates a digital reception signal RX from this reception voltage.

Figure 3:
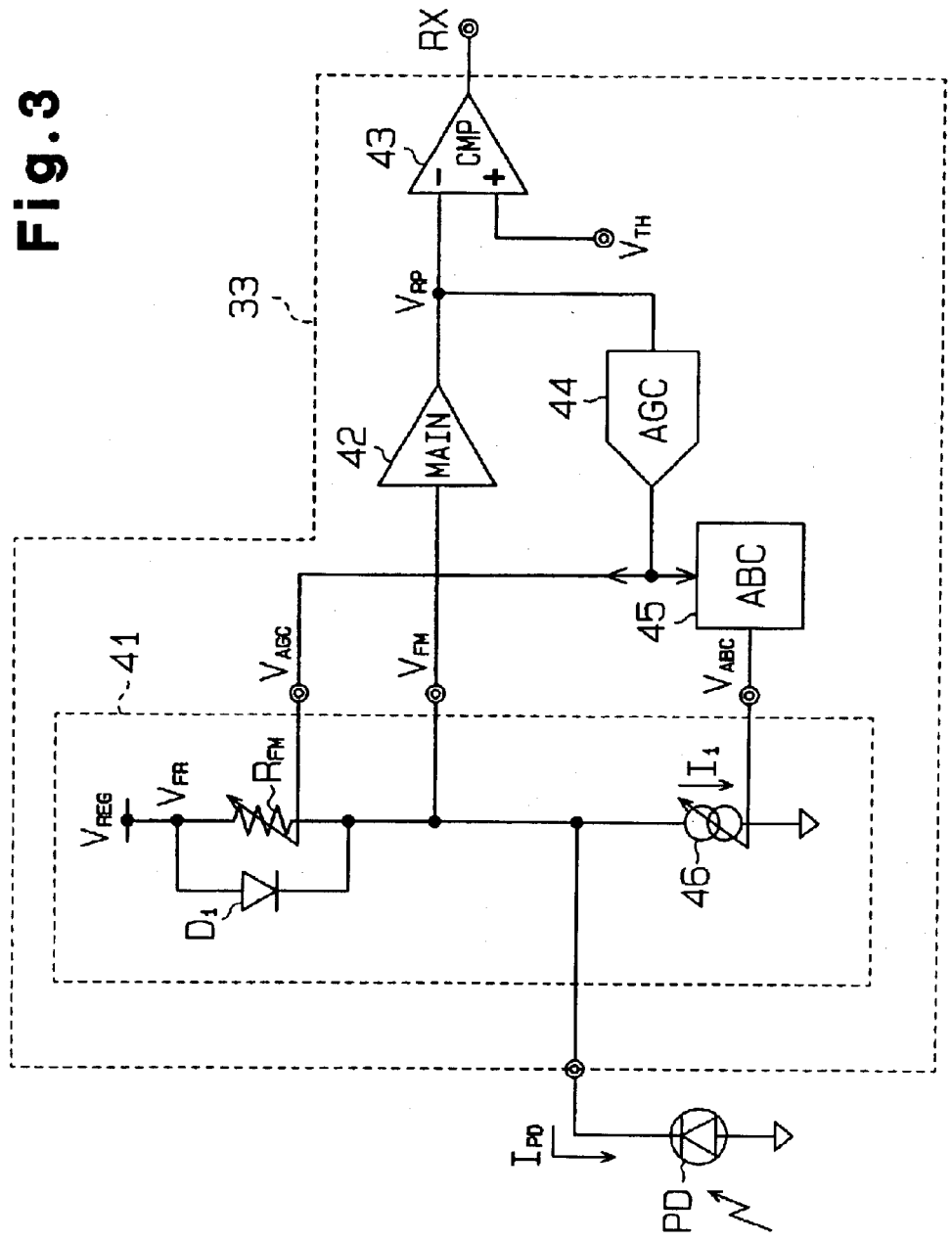
FIG. 3 is a circuit diagram of a first embodiment of the optical receiver amp of the present invention.

As shown in FIG. 3, the optical receiver amp 33 includes a pre-amp 41, a main amp 42, a comparator 43, an auto gain control (AGC) circuit 44, and an auto bias control (ABC) circuit 45.

The pre-amp 41 converts the reception current IPD to a voltage (I-to-V) to generate a voltage signal VFM. The main amp 42 amplifies the voltage signal VFM to generate an amplified voltage signal VRP. The comparator 43 converts the voltage signal VRP amplified by the main amp 42 to a digital reception signal RX using a threshold voltage VTH.

The AGC circuit 44 adjusts the gain of the optical receiver amp 33, i.e., the pre-amp 41, to make the voltage of the amplified voltage signal VRP (i.e., the input signal of the comparator 43) of the main amp 42 conform to a voltage suited to digitalization of the reception current by the comparator 43. When the gain of the pre-amp 41 is too high, the gain is adjusted to avoid a reception signal RX having a pulse width outside normal specifications. The AGC circuit 44 receives the voltage signal VRP from the main amp 42, and supplies a gain control signal VAGC to the pre-amp 41 to control the voltage signal VFM of the pre-amp 41 to a predetermined voltage. The pre-amp 41 changes the gain in the current-to-voltage conversion in accordance with the control signal VAGC. That is, the pre-amp 41 changes the voltage value of the voltage signal VFM corresponding to the current value of the reception current IPD in accordance with the control signal VAGC.

The ABC circuit 45 adjusts the bias voltage of the voltage signal VFM output from the pre-amp 41. The ABC circuit 45 receives the control signal VAC from the AGC circuit 44, and generates a bias control signal VABC to minimize the change in the bias voltage of the voltage signal VFM (i.e., the change in potential in the direct current of the voltage signal VFM) from the pre-amp 41 based on the control signal VAGC.

The pre-amp 41 includes a current source 46, a diode D1, and a resistor RFM as a current-to-voltage conversion resistor to convert the reception current IPD flowing through the photodiode PD to a voltage signal VFM. The resistor RFM and current source 46 are connected in series between the operating power supply VREG and a low-potential power supply. The diode D1 has an anode connected to a first node between the operating power supply VREG and the resistor RFM, and a cathode connected to a second node between the resistor RFM and the current source 46. The photodiode PD is connected to the second node. The current source 46 supplies a predetermined bias current I1 to the resistor RFM.

The resistor RFM is a variable resistance element which can change its own resistance value in accordance with a control signal (control signal VAGC); for example, a P-channel MOS-type transistor may be used. The transistor changes the resistance value in accordance with the current or voltage applied to a control terminal (gate). The resistor RFM may be a compound resistor combining a MOS-type transistor and a resistor. Furthermore, the resistor RFM also may be a bipolar transistor.

The current source 46 has a current changing function for changing the amount of current in accordance with a control signal (bias control signal VABC). For example, the current source 46 can use a transistor, and change the amount of current supplied by the current source 46 by changing the voltage or current applied to the control terminal (gate or base) of this transistor.

As mentioned above, the resistor RFM changes its own resistance value in accordance with the voltage of the gain control signal VAGC, and the current source 46 changes the value of the current I1 in accordance with the voltage of the bias control signal VABC. For example, when the voltage of the voltage signal VRP from the main amp 42 exceeds a predetermined voltage, the AGC circuit 44 generates a gain control signal VAGC to decrease the gain of the pre-amp 41. The resistor RFM reduces its own resistance value in accordance with the gain control signal VAGC. The ABC circuit 45 generates a bias control signal VABC in accordance with the gain control signal VAGC, and the current source 46 increases the amount of current of the current I1 in accordance with the bias control signal VABC.

The pre-amp 41 generates the voltage signal VFM possessing a voltage at the output node between the resistor RFM and the current source 46. Since the amount of the current I1 from the current source 46 changes in correspondence with the change in the resistance value of the resistor RFM, the voltage at the node between the resistor RFM and the current source 46 is maintained at a substantially constant voltage. That is, the AGC circuit 44 adjusts the gain of the pre-amp 41 by changing the resistance value of the resistor RFM to have the voltage of the voltage signal VRP approach a predetermined voltage in accordance with the voltage signal VRP from the main amp 42. The ABC circuit 45 adjusts the bias current at the output node of the pre-amp 41 to minimize the change in the DC voltage component of the voltage signal VFM in accordance with the voltage signal VRP from the main amp 42.

Figure 4:
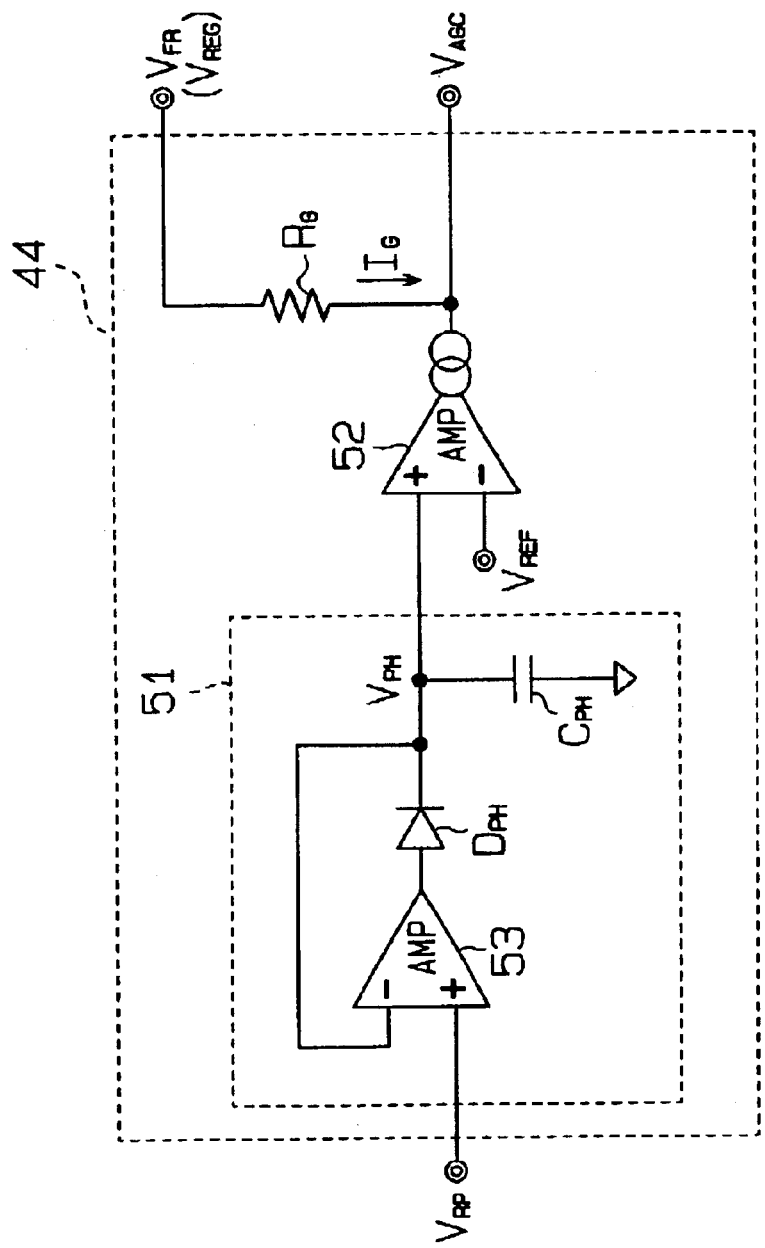
FIG. 4 is a circuit diagram of the auto gain control circuit of the optical receiver amp of FIG. 3.

As shown in FIG. 4, the AGC circuit 44 includes a peak-hold circuit 51, an amp 52, and a resistor RG. The peak-hold circuit 51 holds the peak level of the voltage signal VRP, and generates a peak-hold signal VPH. The peak-hold circuit 51 includes an amp 53, a diode DPH, and a capacitor CPH. The output terminal of the amp 53 is connected to an inverted input terminal of the amp 53 through the diode DPH. The voltage signal VRP from the main amp 42 is supplied to the non-inverted input terminal of the amp 53. The capacitor CPH is connected between a low-potential power supply and a node between the capacitor CPH and the non-inverted input terminal of the amp 53.

The peak-hold signal VPH from the peak-hold circuit 51 is supplied to the non-inverted input terminal of the amp 52, and a reference signal VREF for determining the bias voltage of the pre-amp 41 is supplied to the inverted input terminal. The output terminal of the amp 52 is connected to a node between the operating power supply VREG and the resistor RFM through the resistor RG. Accordingly, the voltage VFR of the node is applied to the resistor RG. The amp 52 is a current output-type amp, which supplies to the resistor RG a current IG corresponding to the difference in potential between the peak-hold signal VPH and the reference signal VREF, and generates a gain control signal VAGC having a voltage corresponding to the current IG.

Figure 5:
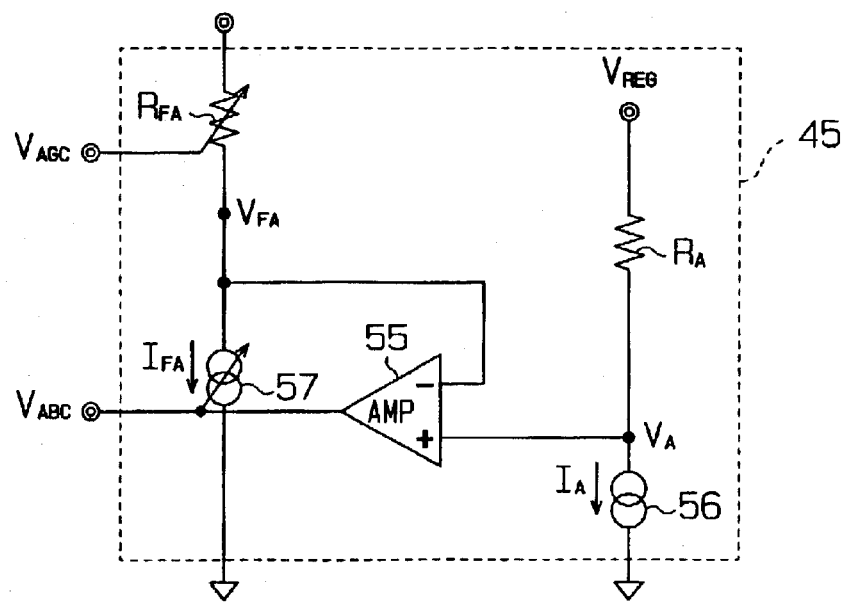
FIG. 5 is a circuit diagram of the auto bias control circuit of the optical receiver amp of FIG. 3.

As shown in FIG. 5, the ABC circuit 45 includes an amp 55, a first current source 56, a second current source 57, a first resistor RA, and a second resistor RFA.

The current source 56 and the first resistor RA, which is a fixed resistor, are connected between the operating power supply VREG and the low-potential power supply. The second current source 57 and the second resistor RFA are connected between the operating power supply VREG and the low-potential power supply. The node between the first resistor RA and the first current source 56 is connected to the non-inverted input terminal of the amp 55, and the inverted input terminal is connected to a node between the second resistor RFA and the second current source 57.

The second resistor RFA is a variable resistance element having substantially the same characteristics as the resistor RFM shown in FIG. 3. The second resistor RFA changes its own resistance value to a resistance value substantially similar to or proportional to the resistance value of the resistor RFM in accordance with the gain control signal VAGC.

The second current source 57 has a current changing function to change the amount of current in accordance with the control signal, and has electrical properties substantially similar to the current source 46. Accordingly, the second current source 57 generates a current IFA corresponding to the output signal of the amp 55, and the amp 55 generates a bias control signal VABC corresponding to the current IFA.

The ABC circuit 45 controls the current IFA of the second current source 57, and generates a bias control signal VABC having a voltage which satisfies the condition (RA·IA)=(RFA·IFA). Each item in this expression represents the electrical properties (resistance value, current value) of the element.

The bias control signal VABC is supplied to the current source 46 shown in FIG. 3, and the bias current I1 is adjusted via the voltage of the bias control signal VABC. Accordingly, the ABC circuit 45 controls the current source 46 and adjusts the bias current I1, and substantially equalizes the voltage VA at the node between the first resistor RA and the first current source 56 and the voltage of the voltage signal of the pre-amp 41 (VA=VFM=(RFM·I1).

Figure 7:
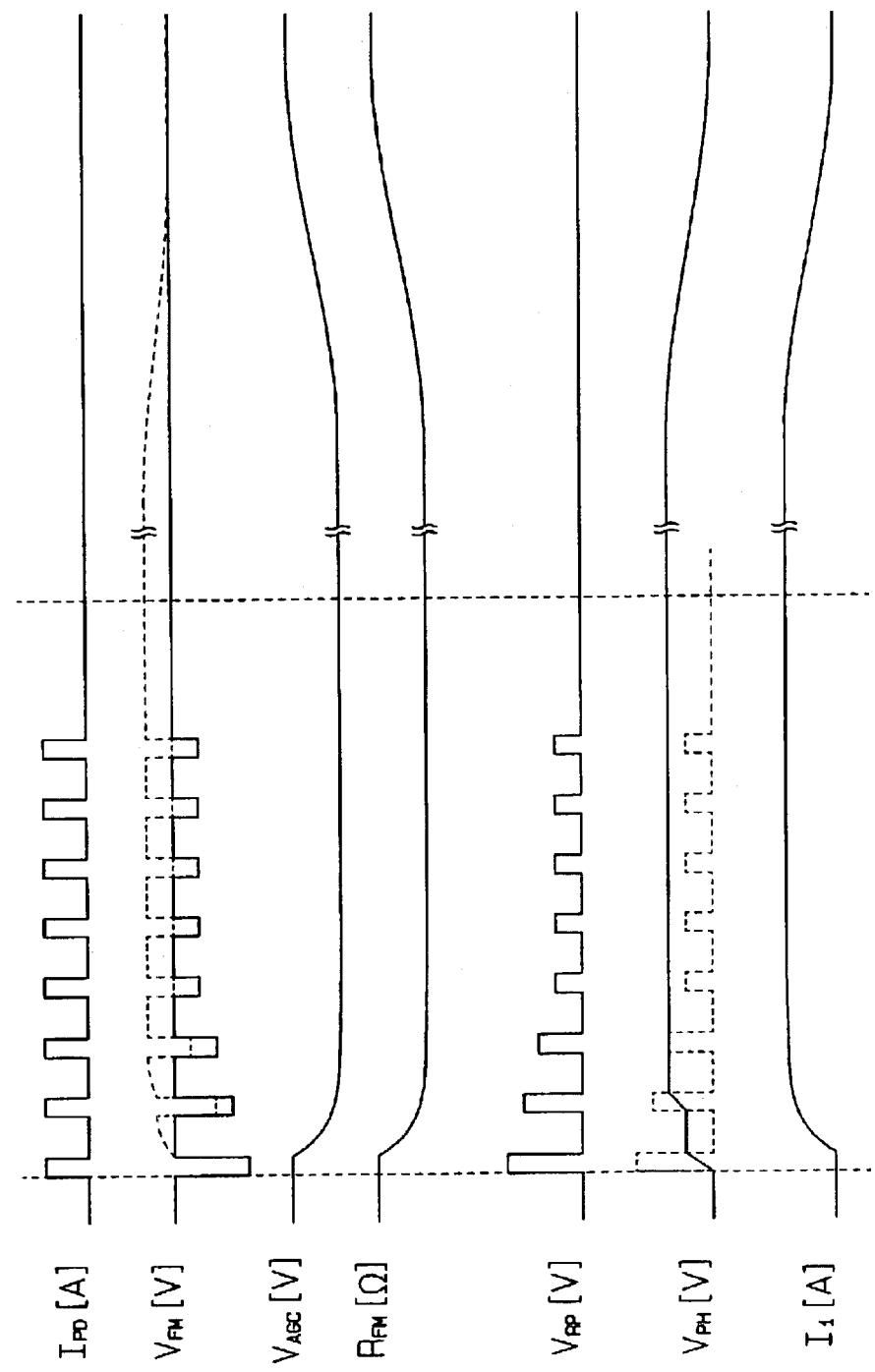
FIG. 7 is a waveform diagram showing the operation of the optical receiver amp of FIG. 3.

The operation of the optical receiver amp 33 is described below with reference to FIG. 7.

When a pulse-like reception current IPD flows through the photodiode PD in response to the incident signal light, the pre-amp 41 converts the reception current IPD to a voltage to generate a voltage signal VFM. The main amp 42 amplifies the voltage signal VFM to generate an amplified voltage signal VRP. The AGC circuit 44 generates a gain control signal VAGC based on the signal VPH having the peak-hold voltage maintained in the peak-hold circuit 51.

When the voltage of the voltage signal VRP from the main amp 42 exceeds a predetermined voltage, the AGC circuit 44 reduces the gain of the pre-amp 41, and generates a gain control signal VAGC to reduce the resistance value of the resistor RFM. The ABC circuit 45 generates a bias control signal VABC to change the bias current I1 of the current source 46 by only the change in current Δi in correspondence with the change in resistance Δr of the resistor RFM by means of the gain control signal VABC. Accordingly, the pre-amp 41 generates a voltage signal VFM, such that VFM=(RFM·I1)≈(RFM+Δr)·(I1+Δi), to minimize the fluctuation in the DC voltage component voltage signal VFM. The dashed line in FIG. 7 shows the waveform of the voltage signal output from the pre-amp of an optical receiver amp not provided with the ABC circuit 45.

The optical receiver amp 33 of the first embodiment possesses the following advantages.

(1) The AGC circuit 44 changes the resistance value of the current-to-voltage conversion resistor RFM to make the voltage of the voltage signal VRP approach a predetermined voltage based on the voltage signal VRP of the main amp 42 and adjusts the gain of the pre-amp 41. The ABC circuit 45 adjusts the bias current at the output node of the pre-amp 41 based on the voltage signal VRP of the main amp 42. As a result, the gain of the pre-amp 41 is adjusted, and the change in the DC voltage component of the voltage signal VFM is minimized by the gain adjustment.

(2) The AGC circuit 44 changes the resistance value of the resistor RFM to adjust the gain of the pre-amp 41, and the ABC circuit 45 adjusts the current value of the current source 46 connected in series to the resistor RFM. As a result, the pre-amp 41 can operate via a low voltage power supply since the control transistors need not be connected in series to the resistor RFM and current source 46.

The first embodiment may be modified as described below.

The AGC circuit 44 may be suitably modified. An AGC circuit 61 of a first modification shown in FIG. 8, includes a peak-hold circuit 51, a first amp 52, a first resistor RG, a second amp 62, a current source 63, and a second resistor RFG. The output terminal of the first amp 52 is connected to the inverted input terminal of the second amp 62, and is connected to the non-inverted input terminal of the second amp 62 through the first resistor RG and the second resistor RFG. The current source 63 is connected between a low-potential power supply and the non-inverted input terminal of the second amp 62. The second resistor RFG is a variable resistance element having characteristics substantially similar to those of the resistor RFM shown in FIG. 3, and the second resistor RFG changes its own resistance value to a resistance value substantially similar to or proportional to the resistance value of the resistor RFM in accordance with the gain control signal VAGC. A voltage VFR is applied to the first resistor RG and the second resistor RFG.

A current IFG corresponding to the difference in potential between the peak-hold signal VPH and the reference signal VREF flows to the output terminal of the first amp 52, and the and the gain control signal VAGC is output from the second amp 62 to satisfy the condition RG·IG=RFG·IFG via the current IFG. Accordingly, the resistance value of the resistor RFM of the pre-amp 41 changes to be proportional to the current IFG. In this way, the adjustment of the resistance value of the resistor RFG is easily accomplished via the current IFG.

Figure 9:
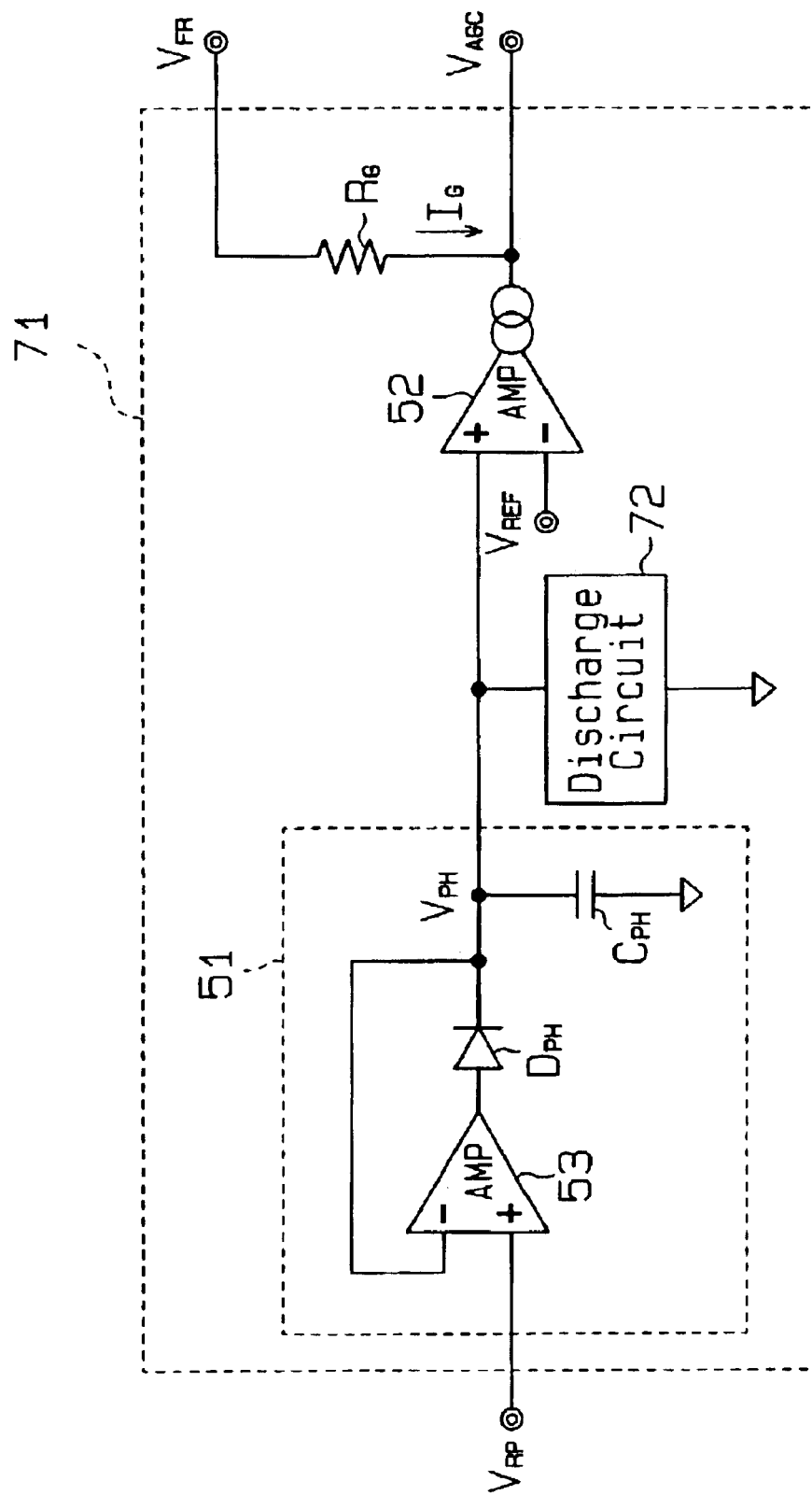
FIG. 9 is a circuit diagram of a second modification of the auto gain control circuit.

As shown in FIG. 9, an AGC circuit 71 of a second modification includes a peak-hold circuit 51, an amp 52, a resistor RG, and a discharge circuit 72. The discharge circuit 72 includes a current source or a fixed resistor, and is connected between a low-potential power supply and the output terminal of the peak-hold circuit 51. The discharge circuit 72 is used to reset the gain of the pre-amp 41 and discharges the charge accumulated in the capacitor CPH of the peak-hold circuit 51. After a voltage signal is no longer continuously supplied, and when the voltage signal has become small, the gain is reset by the discharge circuit 72.

Figure 10:
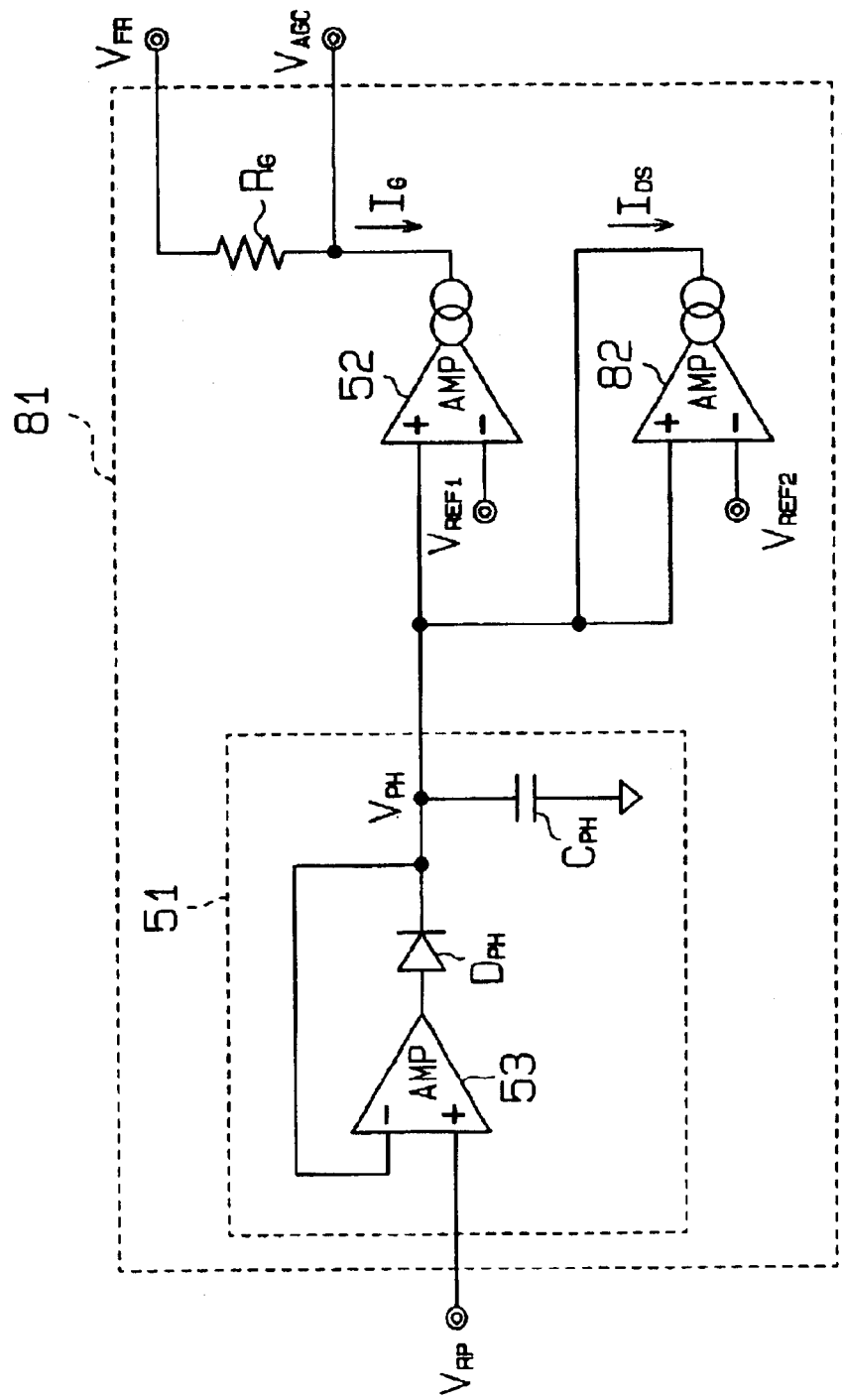
FIG. 10 is a circuit diagram of a third modification of the auto gain control circuit.

As shown in FIG. 10, an AGC circuit 81 of a third modification includes a peak-hold circuit 51, a first amp 52, a resistor RG, and a second amp 82 as a discharge circuit. The first amp 52 is a current output-type amp, which supplies a current IG corresponding to the difference in potential between a peak-hold signal VPH of the peak-hold circuit 51 and a first reference signal VREF1 that determines the bias voltage of the pre-amp 41 in FIG. 3, and generates a gain control signal VAGC.

Figure 11:
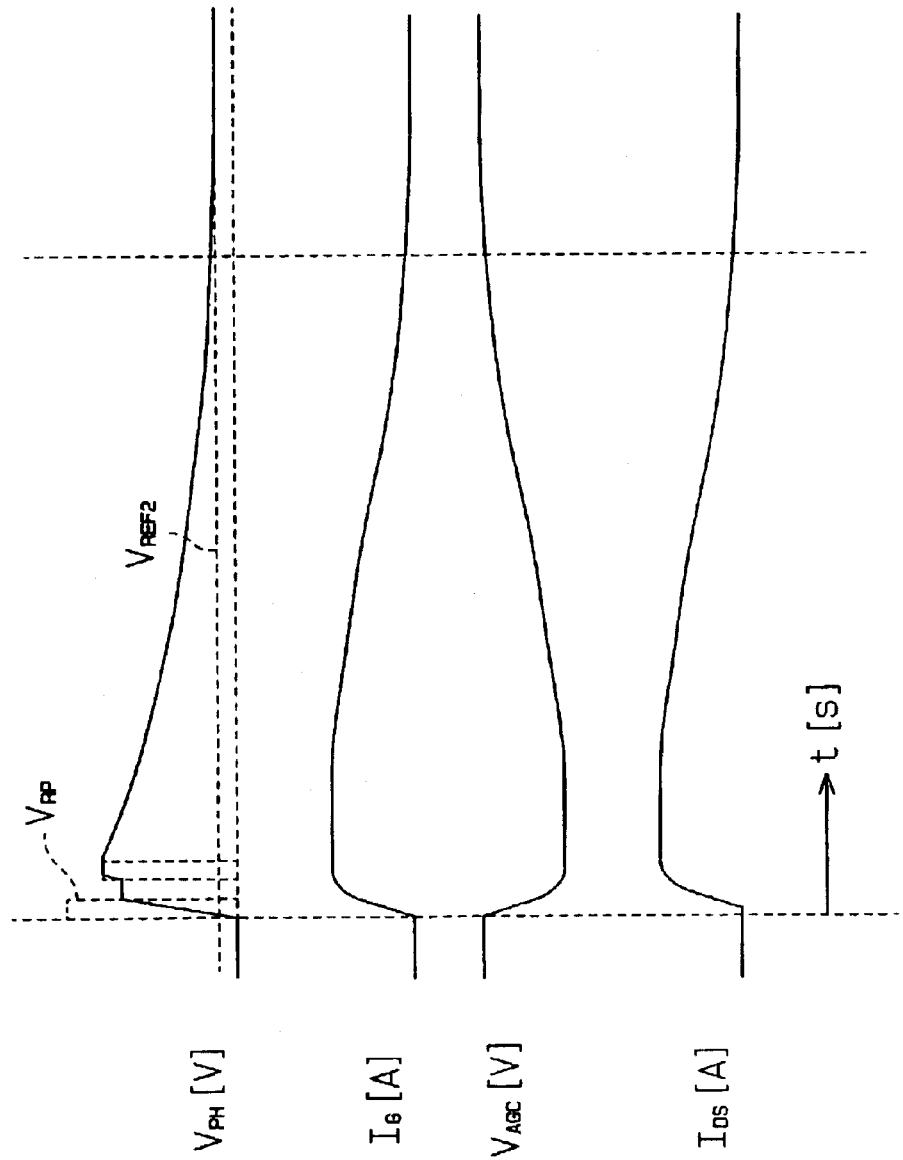
FIG. 11 is a waveform diagram showing the operation of the auto gain control circuit of FIG. 10.

The second amp 82 is a current output-type amp, which amplifies the difference in potential between the peak-hold signal VPH of the peak-hold circuit 51 and a second reference signal VREF2, and generates a current IDS. The current IDS is set, for example, at $1/10^6$ of the current IG by the current mirror of the second amp 82, and is fed back to the non-inverted input terminal of the second amp 82. This current IDS is the discharge current of the capacitor CPH of the peak-hold circuit 51. The discharge current IDS is determined by the relationship IDS=gm·(VDS−VREF2) (where gm represents the conductance of the second amp 82). Accordingly, as shown in FIG. 11, when the voltage of the peak-hold signal VPH is large (i.e., the capacitor CPH has a large charge), the discharge current IDS is also large, whereas when the voltage is small, the discharge current IDS is also small.

The second amp 82 of the AGC circuit 81 can easily set the discharge current and discharge time via the AGC circuit 71 of FIG. 9. If the capacity of the capacitor CPH of the peak-hold circuit 51 is increased, it is easy to control the discharge current. However, when the capacitor CPH is installed in a semiconductor device of an integrated circuit (IC) chip, it is difficult to increase the capacity of the capacitor CPH. Furthermore, since the discharge circuit 72 of FIG. 9 includes a current source and a resistor, the discharge current cannot be adjusted in accordance with the potential of the peak-hold signal VPH.

Figure 12:
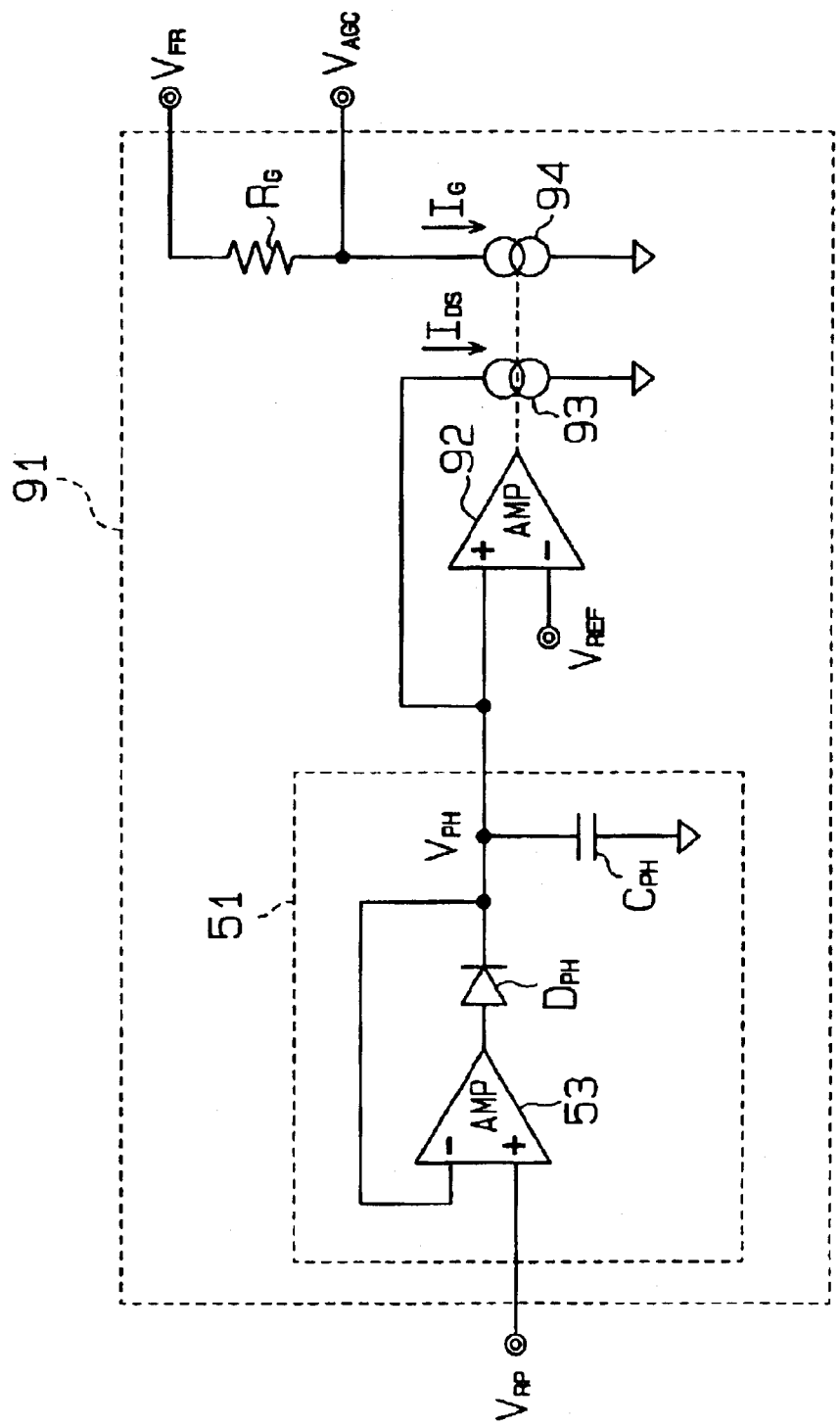
FIG. 12 is a circuit diagram showing a fourth modification of the auto gain control circuit.

As shown in FIG. 12, an AGC circuit 91 of a fourth modification includes a peak-hold circuit 51, a voltage output-type amp 92, a resistor RG, and first and second current sources 93 and 94.

The first current source 93 is connected between a low-potential power supply and the non-inverted input terminal of the amp 92, and includes a transistor mirror-connected to the output terminal of the amp 92 to supply a current IDS. The second current source 94 is connected between the resistor RG and the low-potential power supply, and includes a transistor mirror-connected to the output terminal of the amp 92 to supply a current IG. The current IDS is set at 1/n of the current IG (e.g., $n=10^6$). The first current source 93 functions as a discharge circuit to discharge the charges of the capacitor CPH of the peak-hold circuit 51, and the second current source 94 generates a gain control signal VAGC. Since the second amp 82 of FIG. 10 is not required in the AGC circuit 91, increases in the number of circuit elements and current consumption are prevented.

In the ABC circuit 45, a current output-type amp 55 may be used, for example, to adjust the current flowing through the current source 46 of the pre-amp 41 via a current mirror of the current flowing to the output transistor of the amp 55.

Figure 8:
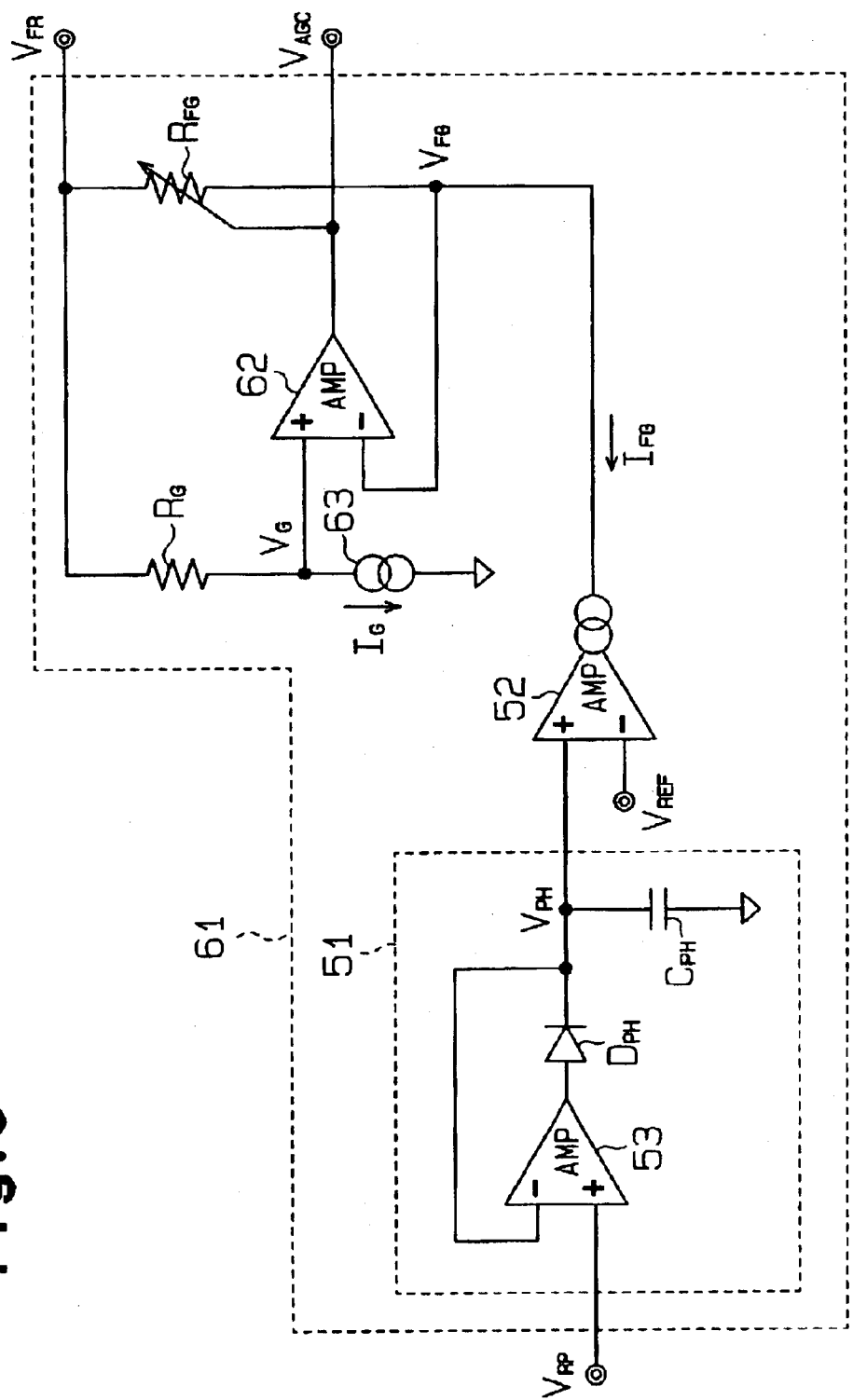
FIG. 8 is a circuit diagram of a first modification of the auto gain control circuit.

Furthermore, an ABC circuit can be realized in which a current mirror circuit for receiving the current IFG of FIG. 8 is included, and the current of the current mirror receiving the current IFG can be amplified, and the amplified current of the current mirror can be used to adjust the current flowing through the current source 46 of the pre-amp 41.

Figure 13:
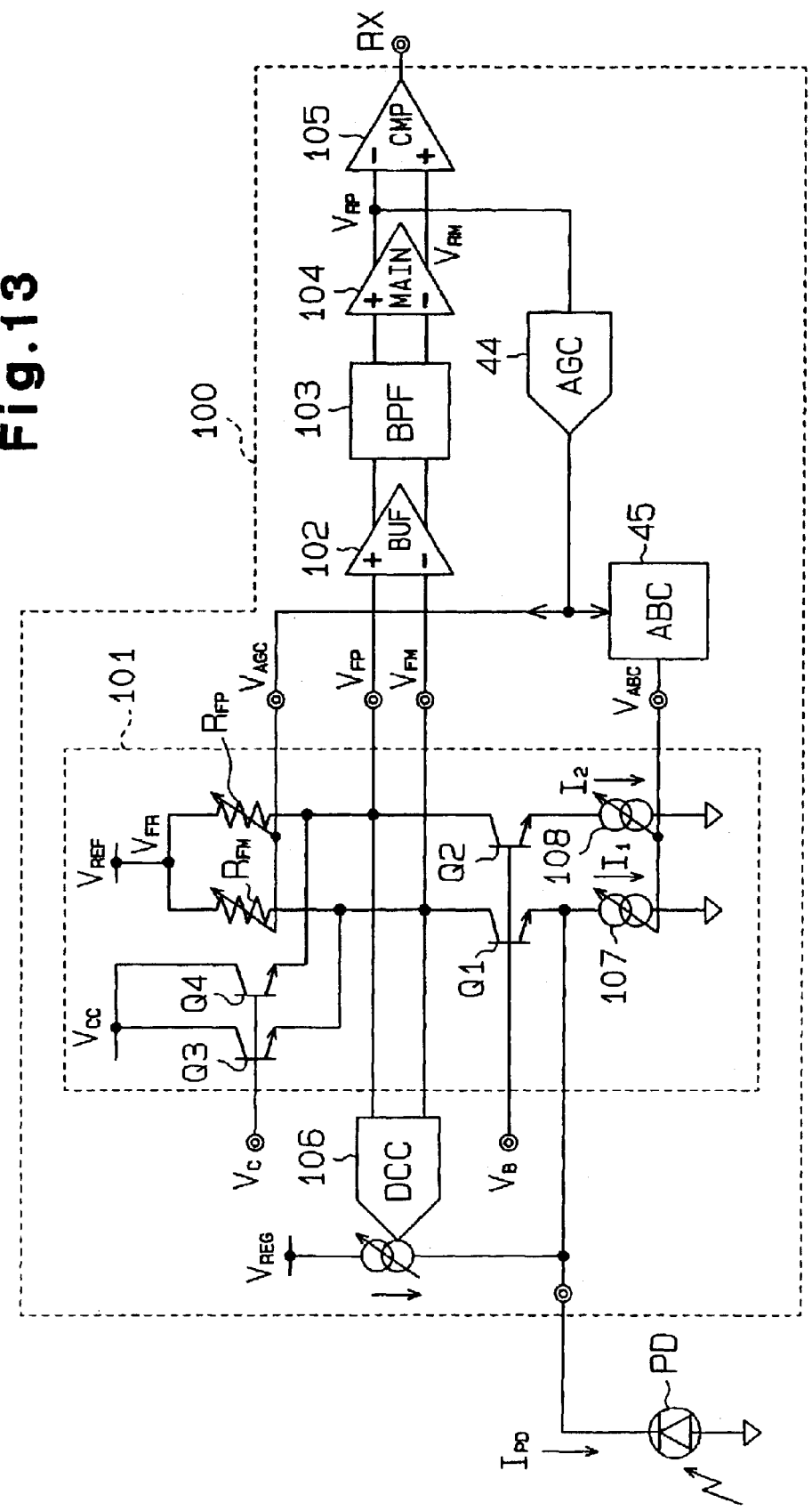
FIG. 13 is a circuit diagram of a second embodiment of the optical receiver amp of the present invention.

As shown in FIG. 13, an optical receiver amp 100 of a second embodiment of the invention is a differential-type amp, and includes a pre-amp 101, a buffer circuit 102, a bandpass filter (BPF) 103, a main amp 104, a comparator 105, a DC light-canceling circuit 106, the AGC circuit 44, and the ABC circuit 45.

The pre-amp 101, the buffer circuit 102, the bandpass filter 103, and the main amp 104 each have differential output.

The pre-amp 101 includes two resistors RFM and RFP, four transistors Q1 through Q4, and two current sources 107 and 108. The resistor RFM, the transistor Q1, and the current source 107 are connected in series between the operating power supply VREG and a low-potential power supply. The resistor RFP, the transistor Q2, and the current source 108 are connected in series between the operating power supply VREG and a low-potential power supply. A predetermined bias voltage VB is applied to the bases of the transistors Q1 and Q2. A photodiode PD is connected at a node between the transistor Q1 and the current source 107.

The transistor Q3 is connected between a high-potential power supply VCC and the first node between the resistor RFM and the transistor Q1, and a predetermined clamp voltage Vc is applied to its base. The transistor Q4 is connected between the high-potential power supply Vcc and the second node between the resistor RFP and the transistor Q2, and a clamp voltage Vc is applied to its base. The transistors Q3 and Q4 are ON when a relatively large input current is supplied, and comprise a clamping circuit for clamping the voltage signals VFM and VFP at predetermined voltages.

The pre-amp 101 converts the reception current IPD flowing through the photodiode PD to a voltage, generates a main voltage signal VFM at the first node, and generates a reference voltage signal VFP at the second node. The buffer circuit 102, the bandpass filter 103, and the main amp 104 each generate a main signal and a reference signal. The reference signal of the main amp 104 is supplied to the AGC circuit 44. The main signal of the main amp 104 also may be supplied to the AGC circuit 44. The main signal or reference signal of the buffer circuit 102 also may be supplied to the AGC circuit 44.

The resistors RFM and RFP have identical electrical properties, and are variable resistance elements such as, for example, P-channel MOS transistors which can change their resistance value in accordance with the voltage of a control signal (gain control signal VAGC).

The current sources 107 and 108 have identical electrical properties, and change the amount of current in accordance with a control signal (bias control signal VABC). For example, the current sources 107 and 108 may each use a transistor to change the amount of current in correspondence with the voltage (or current) applied to a control terminal (gate or base). The current source 107 changes the amount of the current I1 in accordance with the voltage of the bias control signal VABC, and the current source 108 changes the amount of the current I2 in accordance with the voltage of the bias signal VABC.

When there is no incident light signal, the clamp voltage Vc, the base-emitter voltage VBE of the transistors Q3 and Q4, and the voltage signal VFM conform to the relationship VC−VBE>VFM, and the transistors Q3 and Q4 are turned OFF. The transistors Q3 and Q4 are turned ON when a relatively large input signal is supplied, and they clamp the voltage signals VFM and VFP at predetermined voltages.

The buffer circuit 102, the bandpass filter 103, and the main amp 104 amplify the differential voltage ΔVF (ΔVFP−ΔVFM) of the differential output of the pre-amp 101. The comparator 105 converts the amplified differential output of the main amp 104 to a digital reception signal RX.

The DC light-canceling circuit 106 cancels the direct current (DC component) included in the reception current IPD flowing through the photodiode PD. The DC component is generated by background DC light, such as sunlight and the like, and includes a frequency component lower than a predetermined frequency band including the communication frequency. The DC light-canceling circuit 106 provides a feedback of the current for canceling DC component included in the voltage signals VFM and VFP to the input of the pre-amp 101.

In the optical receiver amp 100 having differential output of the second embodiment, the gain of the pre-amp 101 is adjusted, and the change in the DC voltage component of the voltage signal VFM is minimized via this adjustment.

Figure 14:
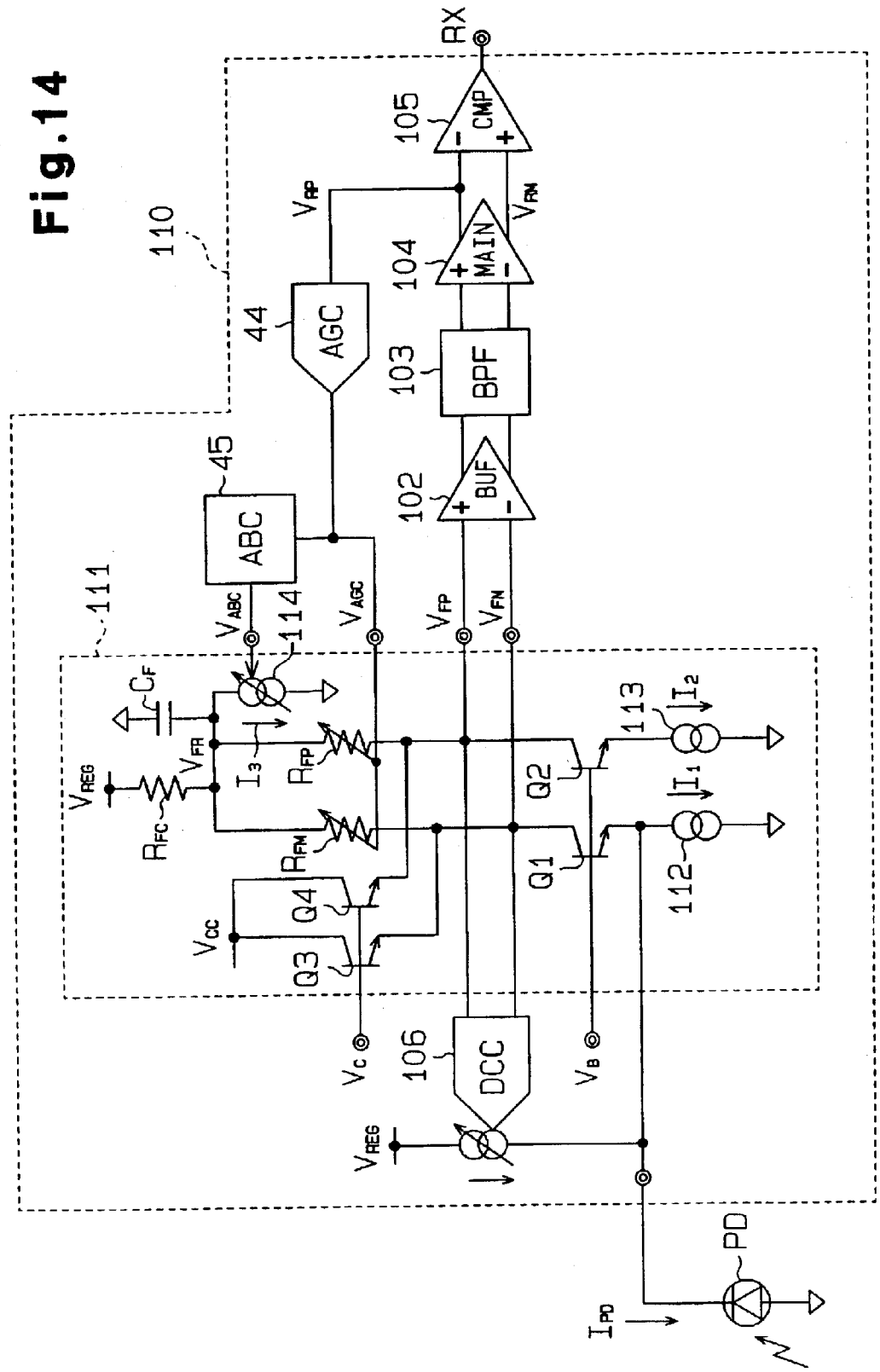
FIG. 14 is a circuit diagram of a third embodiment of the optical receiver amp of the present invention.

As shown in FIG. 14, an optical receiver amp 110 of a third embodiment of the present invention is a differential-type amp, and includes a pre-amp 111, the buffer circuit 102, the bandpass filter 103, the main amp 104, the comparator 105, the DC light-canceling circuit 106, the AGC circuit 44, and the ABC circuit 45. The pre-amp 111, the buffer circuit 102, the bandpass filter 103, and the main amp 104 each have differential output.

The pre-amp 111 includes three resistors RFM, RFP, and RFC, four transistors Q1 through Q4, three current sources 112, 113, and 114, and a capacitor CF.

The resistor RFC is connected to a high-potential power supply. The resistor RFM, the transistor Q1, and the current source 112 are connected in series between the resistor RFC and a low-potential power supply. The resistor RFP, the transistor Q2, and the current source 113 are connected in series between the resistor RFC and a low-potential power supply. A predetermined bias voltage VB is applied to the bases of the transistors Q1 and Q2. A photodiode PD is connected at a node between the transistor Q1 and the current source 107.

The transistor Q3 is connected between the high-potential power supply Vcc and the first node between the resistor RFM and the transistor Q1, and a predetermined clamp voltage Vc is applied to its base. The transistor Q4 is connected between the high-potential power supply Vcc and the second node between the resistor RFP and the transistor Q2, and a predetermined clamp voltage Vc is applied to its base.

A current source 114 is connected between the low-potential power supply and the third node between the resistors RFM and RFP. A capacitor CF is connected between the low-potential power supply and the third node.

Each of the resistors RFM and RFP are variable resistance elements capable of changing their own resistance value in accordance with a gain control signal VAGC. The third resistor RFC is a fixed resistance element.

The current source 112 is a constant current source for generating a current I1, and the current source 113 is a constant current source for generating a current I2. The current source 114 is a variable current source for changing a current I3 in accordance with a bias control signal VABC. The current I3 is adjusted by the bias control signal ABC generated by the AGC circuit 45 in correspondence with changes in the resistance values of the resistors RFM and RFP. The DC voltage component of the differential output voltage signals VFM and VFP of the pre-amp 111 are controlled by adjusting the current I3.

Since the change $\Delta$VFM of the DC component of the main voltage signal VFM is represented by the expression $\Delta\text{VFM}=\Delta\text{VFR}=(\text{RFC}\cdot\Delta\text{I3})$, the bias potential can be easily set via the resistor RFC and current I3.

The capacitor CF may be omitted when the resistance value of the resistor RFC is relatively small. When the resistor RFC has a large resistance value, the reference voltage signal VFP attains the same phase as the main voltage signal, and swing is generated in the differential output. Therefore, the capacitor CF is necessary to suppress this swinging.

The optical receiver amp 110 of the third embodiment provides the following advantages.

A fixed resistance resistor RFC is connected between the high-potential power supply and the node between the resistors RFM and RFP, and the current source 114 is connected between the low-potential power supply and the node. The gain can be adjusted by changing the resistance values of the resistors RFM and RFP, and the current I3 of the current source 114 can be adjusted via this gain adjustment. Accordingly, the DC voltage component of the voltage signals VFM and VFP can be adjusted to minimize the change in the DC voltage component of the voltage signals VFM and VFP.

Figure 15:
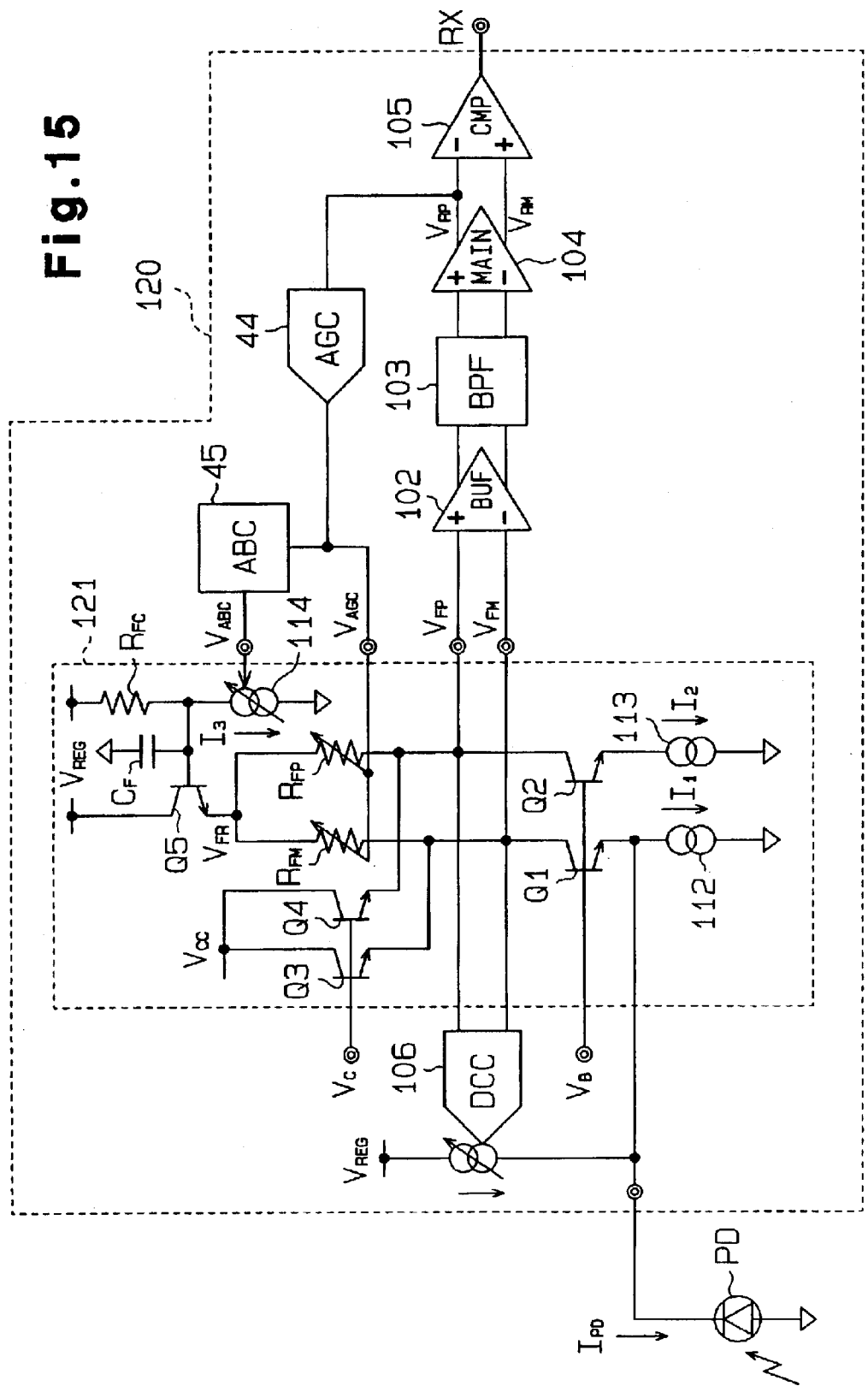
FIG. 15 is a circuit diagram of a fourth embodiment of the optical receiver amp of the present invention.

As shown in FIG. 15, the optical receiver amp 120 of a fourth embodiment is a differential-type amp, and includes a pre-amp 121, the buffer circuit 102, the bandpass filter 103, the main amp 104, the comparator 105, the DC light-canceling circuit 106, the AGC circuit 44, and the ABC circuit 45. The pre-amp 121, the buffer circuit 102, the bandpass filter 103, and the main amp 104 each have differential output.

The pre-amp 121 includes three resistors RFM, RFP, and RFC, five transistors Q1 through Q5, three current sources 112, 113, and 114, and one capacitor CF.

A node between the resistor RFM and the resistor RFP is connected to an operating power supply VREG through the transistor Q5, which is an NPN transistor. Specifically, the emitter of the transistor Q5 is connected to the node between the resistors RFM and RFP, the collector is connected to the operating power supply VREG, and the base is connected to a node between the resistor RFC and the current source 114. Furthermore, the base of the transistor Q5 is connected to the operating power supply VREG through the capacitor CF. An N-channel MOS transistor may be substituted for the NPN transistor in the transistor Q5.

Bias adjustment of the optical receiver amp 120 is accomplished using the resistor RFC and the transistor Q5. Since a resistor RFC having a resistance value larger than the resistor RFC of the third embodiment may be used in the optical receiver amp 120, only a small adjustment margin is used for the bias current I3.

The transistor Q5 works as an emitter follower, which, with regard to the DC voltage, shifts the DC voltage. The base voltage of the transistor Q5 is adjusted by the bias current I3 to adjust the DC voltage current of the voltage signal VFM. The voltage signal VFM of the pre-amp 121 is set as follows.

$$VFM=VFR-RFM\cdot I1$$

$$VFR=VREG-(RFC\cdot I3)-VBE(Q5)$$

In the fourth embodiment, the transistor Q5 is connected between the operating power supply VREG and the node between the resistors RFM and RFP, and the base of the transistor 5 is connected to a node between the fixed resistor RFC and the current source 114. The gain of the pre-amp 121 is adjusted by changing the resistance values of the resistors RFM and RFP, and the current I3 of the current source 114 is changed by this gain adjustment. Since a resistor RFC having as resistance value larger than the resistor RFC of the third embodiment may be used in the fourth embodiment, the adjusted bias current becomes small.

Figure 16:
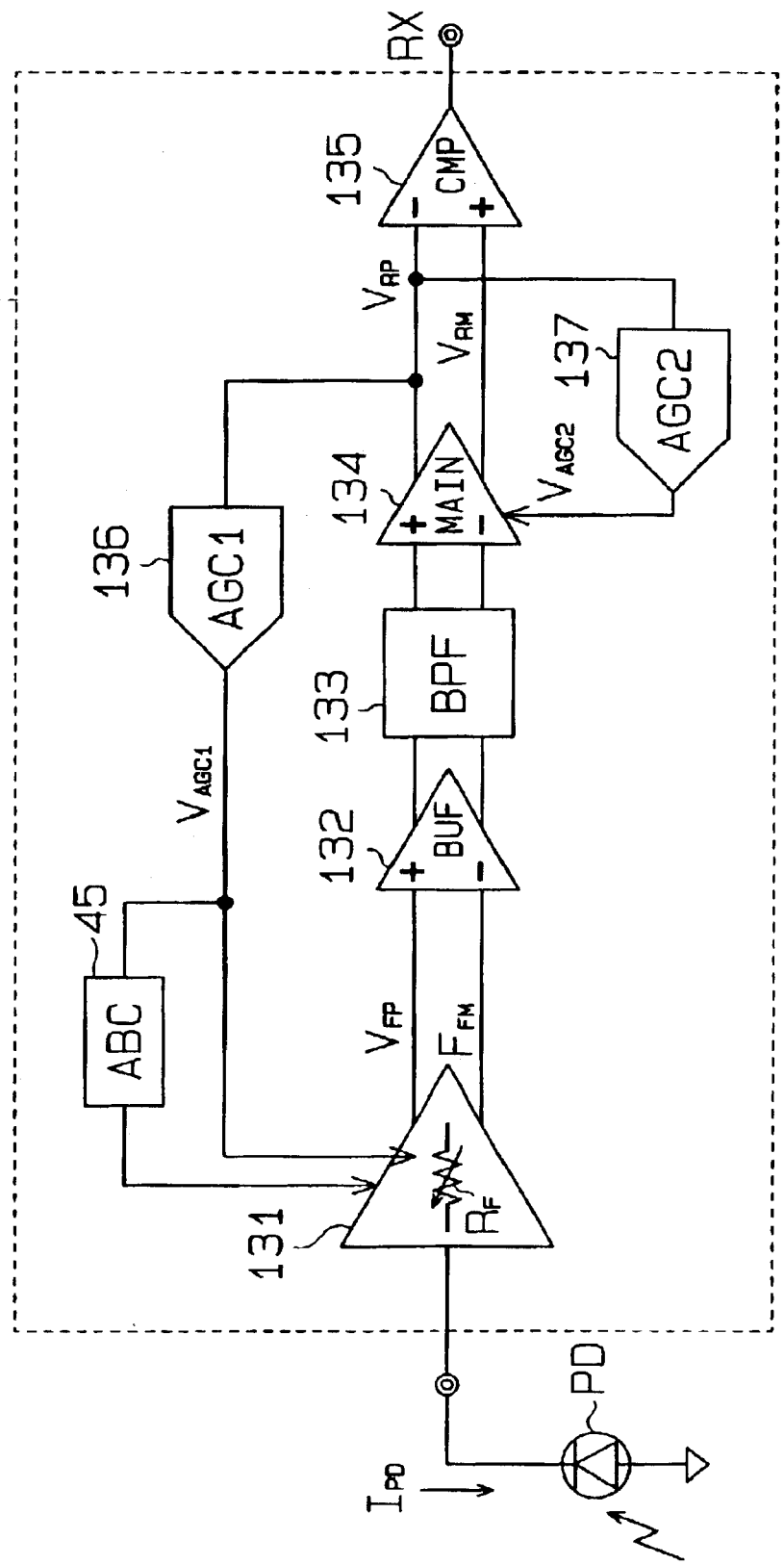
FIG. 16 is a circuit diagram of a fifth embodiment of the optical receiver amp of the present invention.

An optical receiver amp 130 of a fifth embodiment shown in FIG. 16 includes the ABC circuit 45, a pre-amp 131, a buffer circuit 132, a bandpass filter 133, a main amp 134, a comparator 135, a first AGC circuit 136, and a second AGC circuit 137. The optical receiver amp 130 also includes a DC light-canceling circuit 26 not shown in the drawing. The pre-amp 131, the buffer circuit 132, the bandpass filter 133, and the main amp 134 each have differential output.

The pre-amp 131 may be any one of the pre-amps 101, 111, or 121. The pre-amp 131 converts the reception current IPD flowing through the photodiode PD to a voltage, and generates a main voltage signal VFM and a reference voltage signal VFP. The resistor RF shown within the block of the pre-amp 131 shown in FIG. 16 may be one of the resistors RFM and RFP in any of the pre-amps 101, 111, and 121.

The voltage signals VFM and VFP of the pre-amp 131 are supplied to the main amp 134 through the buffer circuit 132 and the bandpass filter 133, and the main amp 134 amplifies the voltage signals VFM and VFP to generate a main signal VRM and a reference signal VRP. The comparator 135 generates a digital reception signal RX using the main signal VRM and the reference signal VRP of the main amp 134.

The first AGC circuit 136 adjusts the gain of the pre-amp 131, and the second AGC circuit 137 adjusts the gain of the main amp 134.

The first AGC circuit 136 has a circuit structure identical to that of the AGC circuit 44 in FIG. 4, and generates a first gain control signal VAGC1 based on the reference signal VRP of the main amp 134, and supplies this first gain control signal VAGC1 to the pre-amp 131. The resistance value of the resistor RF of the pre-amp 131 is adjusted via the first gain control signal VAGC1. The first AGC circuit 136 also may have a circuit structure identical to the AGC circuit 61 in FIG. 8, the AGC circuit 71 in FIG. 9, the AGC circuit 81 in FIG. 10, or the AGC circuit 91 in FIG. 12.

The second AGC circuit 137 starts operating when the amount of adjustment of the gain of the pre-amp 131 via the first AGC circuit 136 approaches the vicinity of a threshold. The first and second AGC circuits 136 and 137 each have threshold values used as references for determining whether or not to start operation based on the reference signal VRP of the main amp 134. Since the second AGC circuit 137 operates when the reference signal VRP is sufficiently large, high operating precision is not required. Accordingly, the second AGC circuit 137 is able to adjust the gain of the main amp 134 in a simpler manner than the first AGC circuit 136. For example, the main amp 134 includes a variable resistor connected between differential inputs, and the second AGC circuit 137 adjusts the resistance value of the variable resistor. When the main amp has a differential pair, the second AGC circuit 137 adjusts the operating currents of the differential pair. The gain of the optical receiver amp 130 can be comprehensively adjusted by adjusting the threshold voltage of the comparator 135 to attenuate the detection sensitivity.

The optical receiver amp 130 of the fifth embodiment provides the following advantages.

(1) The gain of the pre-amp 131 can be adjusted by the first AGC circuit 136, and the gain of the main amp 134 can be adjusted by the second AGC circuit 137. The gain of the optical receiver amp 130 is comprehensively and effectively adjusted by operating the first and second AGC circuits 136 and 137 in stages to adjust the gain of the optical receiver amp 130.

(2) The second AGC circuit 137 operates after the gain adjustment of the pre-amp 131 via the first AGC circuit 136 approaches the vicinity of a threshold. As a result, the second AGC circuit 137 need not have a precision higher than that of the first AGC circuit 136, and enlargement of the circuit area of the second AGC circuit 137 is avoided.

The fifth embodiment may be modified as follows.

The second AGC circuit 137 also may adjust the gain of the buffer circuit 132 instead of the main amp 134.

The first AGC circuit 136 also may adjust the gain of the pre-amp 131 based on the output signal of the buffer circuit 132. Furthermore, the second AC circuit 137 also may adjust the gain of the buffer circuit 132 based on the output signal of the buffer circuit 132.

Figure 17:
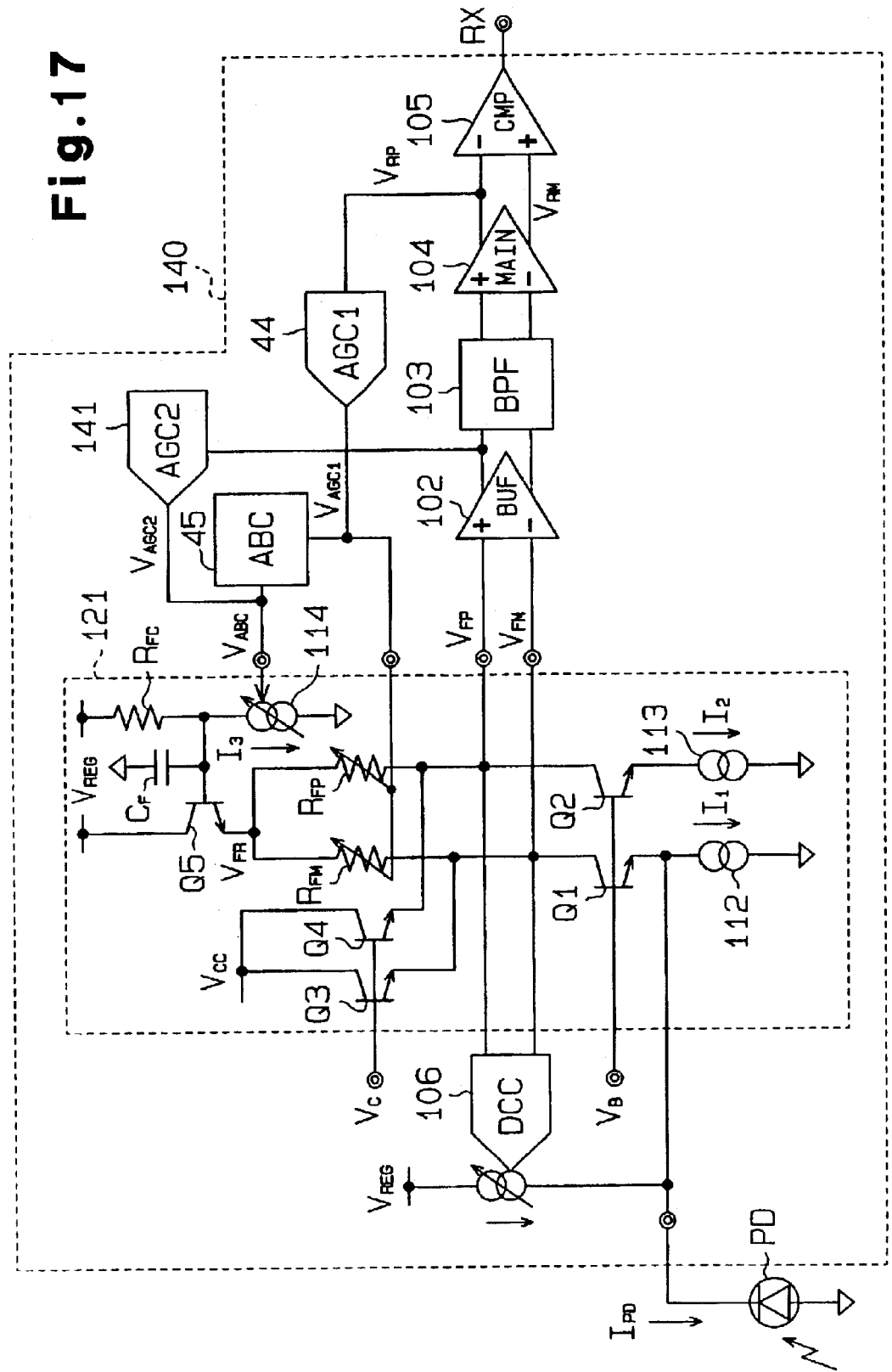
FIG. 17 is a circuit diagram of a sixth embodiment of the optical receiver amp of the present invention.

An optical receiver amp 140 of a sixth embodiment shown in FIG. 17 is a differential-type amp, and includes a pre-amp 121, the buffer circuit 102, the bandpass filter 103, the main amp 104, the comparator 105, the DC light-canceling circuit 106, the first AGC circuit 44, the ABC circuit 45, and a second AGC circuit 141. The optical receiver amp 140 of the sixth embodiment adds a second AGC circuit to the optical receiver amp 120 of FIG. 15. The pre-amp 121, the buffer circuit 102, the bandpass filter 103, and the main amp 104 each have differential output.

The pre-amp 121 includes three resistors RFM, RFP, and RFC, five transistors Q1 through Q5, three current sources 112, 113, and 114, and one capacitor CF.

The first AGC circuit 44 receives a reference signal VRP from the main amp 104, and generates a first gain control signal VAGC1. The ABC circuit 45 receives the first gain control signal VAGC1, and generates a bias control signal VABC for adjusting the bias of the pre-amp 121.

The second AGC circuit 141 receives a reference signal from the buffer circuit 102, and generates a second gain control signal VAGC2. The second gain control signal VAGC2 is supplied together with the bias control signal VABC to the current source 114 of the pre-amp 121. The current source 114 generates a current I3 corresponding to the combined voltages of the bias control signal VABC and the second gain control signal VAGC2.

The second AGC circuit 141 generates the second gain control signal VAGC2 for adjusting the gain of the pre-amp 121 after the resistance values of the resistors RFM and RFP have been reduced to near a limit by the first AGC circuit 44. The current source 114 increases the current I3 in accordance with the bias control signal VABC and the second gain control signal VAGC2, the bias potential is shifted by this current increase, and the voltage of the voltage signal VFM drops. Then, a collector current flows through the clamping transistors Q3 and Q4, and the emitter resistance re of the transistors Q3 and Q4 (i.e., the resistance component between the collector-emitter) is reduced. In this time, when viewed from the voltage signal VFM output terminal of the pre-amp 121, the emitter re and the resistor RFM have parallel connection resistance. This parallel connection resistance functions as a current-to-voltage conversion resistance of the pre-amp 121. Accordingly, in the optical receiver amp 140 of the sixth embodiment, the resistance value of the current-to-voltage conversion resistance becomes substantially smaller compared to when the individual resistance values of the resistors RFM and RFP are reduced, such that the gain of the pre-amp 121 can be dynamically controlled.

Although collector current flows through the transistors Q3 and Q4 when the bias potential shifts and the voltage of the voltage signal VFM drops, the bias voltage shift does not affect the reception signal RX because the pre-amp 121 has a small gain when the reception current IPD is sufficiently large.

Figure 18:
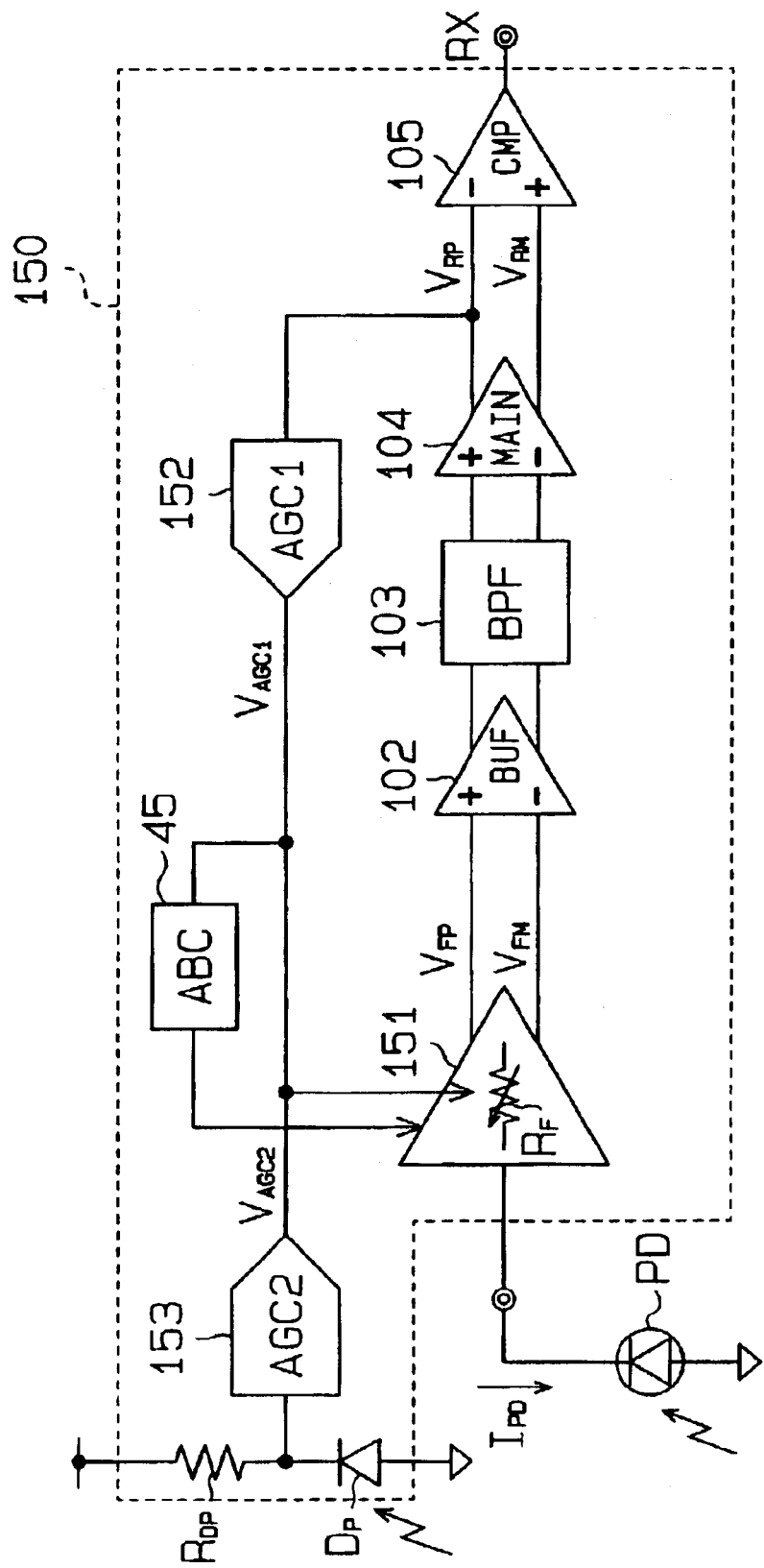
FIG. 18 is a circuit diagram of a seventh embodiment of the optical receiver amp of the present invention.

An optical receiver amp 150 of a seventh embodiment shown in FIG. 18 includes the ABC circuit 45, a pre-amp 151, the buffer circuit 102, the bandpass filter 103, the main amp 104, a comparator 105, a first AGC circuit 152, a second AGC circuit 153, a resistor RDP, and a diode DP as a photodetecting means, and they are simply formed on a semiconductor substrate. The optical receiver amp 150 and a photodiode PD are molded in light-transmitting resin.

The first AGC circuit 152 generates a first gain control signal VAGC1 based on the reference signal VRP of the main amp 104, and supplies this first gain control signal VAGC1 to the pre-amp 151.

The resistor RDP and the diode DP are connected in series between a high-potential power supply Vcc and a low-potential power supply, and a node between the resistor RDP and the diode DP is connected to the input terminal of the second AGC circuit 153. The cathode of the diode DP is connected to the resistor RDP, and the anode of the diode DP is connected to the low-potential power supply.

The diode DP is arranged at a position irradiated by the signal light, similar to the photodiode PD. The diode DP is formed between the semiconductor substrate (P-type) and an island region (N-type) having a relatively large area, and is connected to the region irradiated by signal light in a non-element forming region around the pad and between circuit blocks on the semiconductor substrate.

The diode DP generates a current IDP in response to signal light irradiating the photodiode PD. The second AGC circuit 153 generates a second gain control signal VAGC2 for adjusting the gain of the pre-amp 151 based on the current IDP.

The pre-amp 151 changes the resistance value of the resistor RF in accordance with the first and second gain control signals VAGC1 and VAGC2 to change the gain of the pre-amp 151.

In this optical receiver amp 150, an increase in the chip area is restrained while light leakage caused by excessive signal light is detected, and gain is reduced when the leakage current is large. Leakage current is generated under the following circumstances. For example, in optical communications, the IC of the optical receiver amp and the photodiode on the receiving side are generally molded in light-transmitting resin. In this case, when the receiving side is near the transmitting side, the signal light from the transmitting side irradiates not only the photodiode, but also the IC chip. A leakage current flows through the IC via the irradiation by this excessive signal light, producing an aberration in the operating point, which may easily cause an operational error when the amp has high gain.

Accordingly, in the seventh embodiment, a second gain control signal VAGC2 is generated based on the current IDP flowing through the photodiode PD, and the gain of the pre-amp 151 is adjusted via this second gain control signal VAGC2. That is, a leakage current caused by signal light is detected by the photodiode PD, and the gain of the pre-amp 151 is reduced to prevent operational errors caused by this leakage current.

Furthermore, since the diode DP is formed between the semiconductor substrate (P-type) and an island region (N-type) in the non-element-forming region, the surface area of the chip is not increased.

Figure 19:
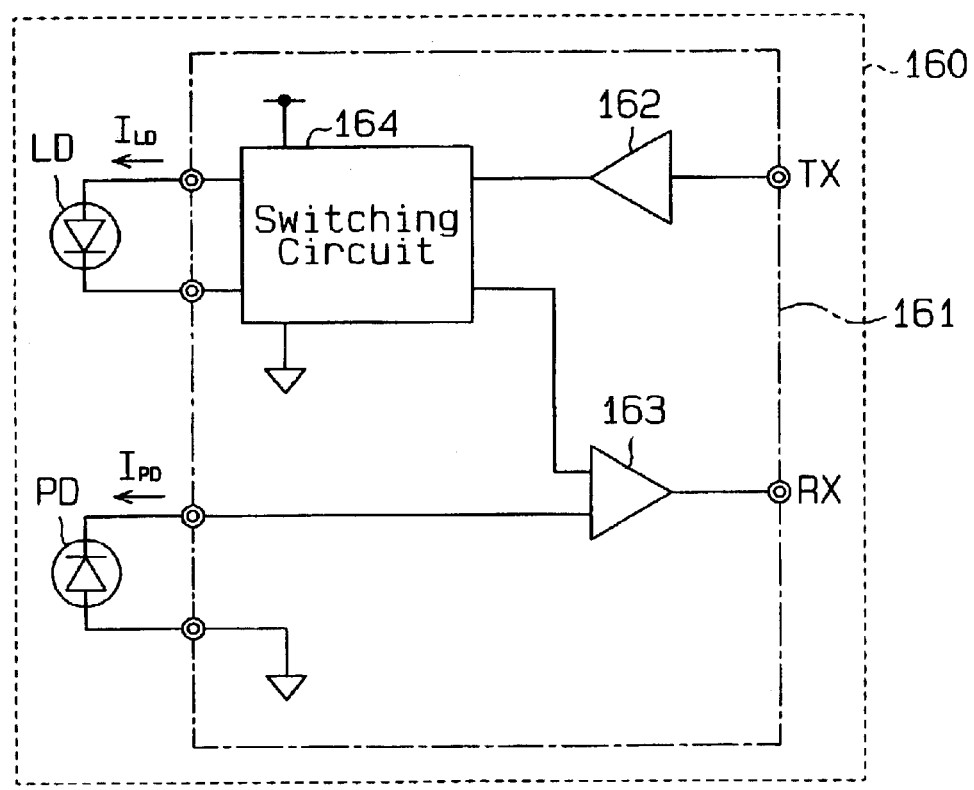
FIG. 19 is a schematic circuit diagram of an optical communication apparatus including a modification of the optical receiver amp of FIG. 18.

In the seventh embodiment, in place of the diode DP, a normal PN diode, a photodiode for monitoring a light-emitting diode LD used for transmission, or a light-emitting diode LD used for transmission also may be used as a photodetecting means. FIG. 19 is a schematic block diagram of an optical communication apparatus using a light-emitting diode LD as a photodetecting means.

The optical communication apparatus (optical communication module) 160 includes a light-emitting diode LD, a photodiode PD, and a transmission-reception circuit 161, and these parts are molded in a light-transmitting resin. The transmission-reception circuit 161 includes an optical transmitting amp 161, an optical receiving amp 163, and a switching circuit 164 as a switching means.

The optical transmitting amp 162 generates a pulse-like transmission current ILD in accordance with a transmission signal TX, and supplies this transmission current ILD to the light-emitting diode LD through the switching circuit 164. The light-emitting diode LD repeatedly emits and quenches in accordance with the transmission current ILD.

The photodiode PD generates a reception current IPD corresponding to the reception light. The optical receiving amp 163 converts the reception current IPD to a voltage (current-to-voltage conversion) to generate a reception voltage, and generates a digital reception signal RX from this reception voltage.

The switching circuit 164 connects the light-emitting diode LD to the optical transmitting amp 162 or the optical receiving amp 163 in accordance with the transmission-reception operation. For example, the switching circuit 164 connects the light-emitting diode LD to the optical transmitting amp 162 during a transmission operation (when, for example, the transmission current ILD flows from the optical transmitting amp 162), and connects the light-emitting diode LD to the optical receiving amp 163 during other operations.

The optical receiving amp 163 has a structure identical to that of the optical receiving amp 150 shown in FIG. 18, and the input terminal of the second AGC circuit 153 of the optical receiving amp 163 is connected to the light-emitting diode LD through the switching circuit 164. The light-emitting diode LD is configured to function as an emitting means for generating transmission signal light during the transmission operation, and function as a photodetecting means for generating a photodetection signal during operations other than the transmission operation.

Figure 20:
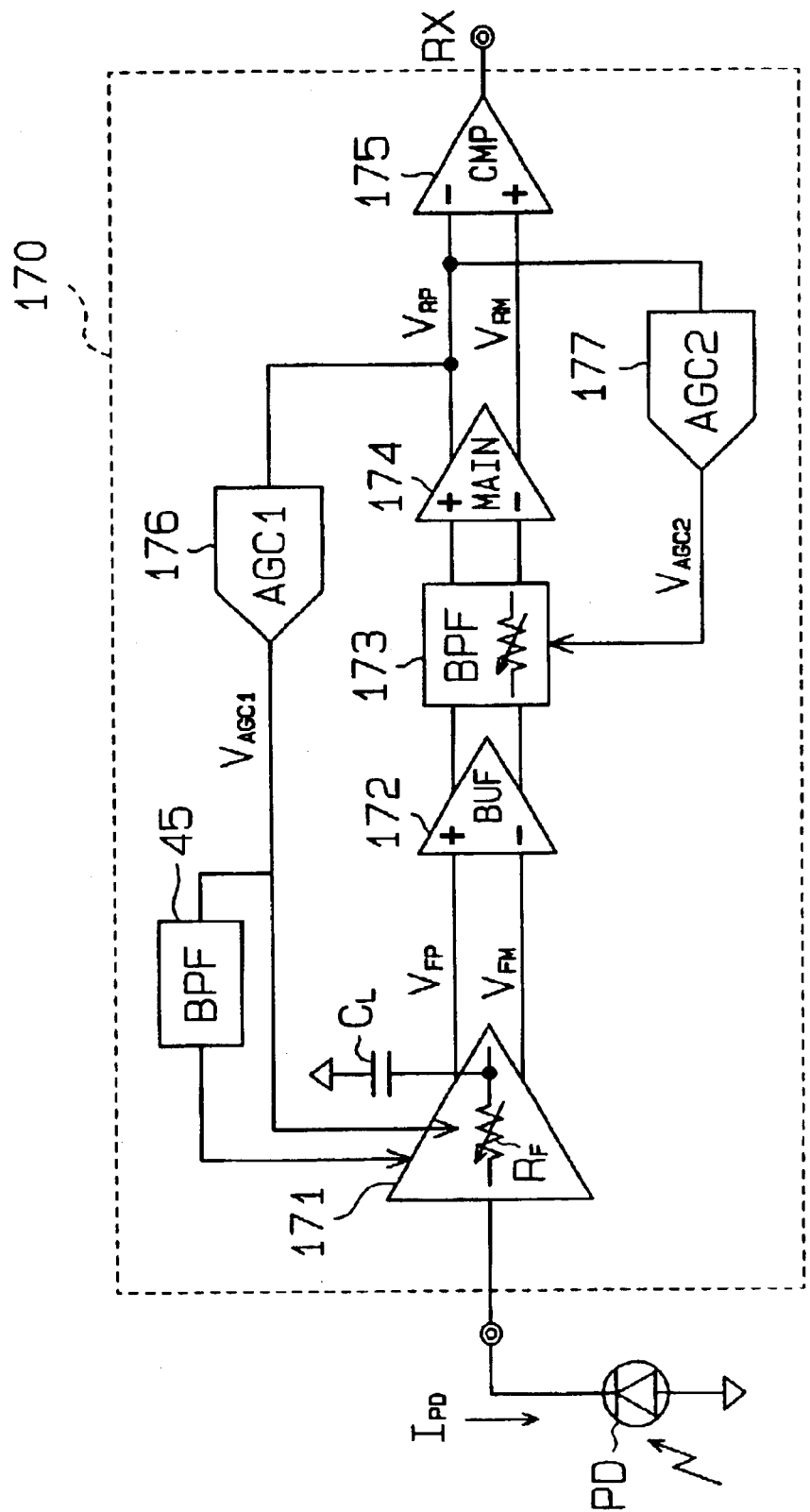
FIG. 20 is a circuit diagram of an eighth embodiment of the optical receiver amp of the present invention.

An optical receiving amp 170 of an eighth embodiment shown in FIG. 20 is a differential-type amp, and includes the ABC circuit 45, a pre-amp 171, a buffer circuit 172, a bandpass filter 173, a main amp 174, a comparator 175, first and second AGC circuits 176 and 177, and a DC light-canceling circuit (not shown in the drawing). The pre-amp 171, the buffer circuit 172, the bandpass filter 173, and the main amp 174 each have differential output.

The pre-amp 171 is constructed by adding a capacitor CL to the pre-amp 101 of FIG. 13, pre-amp 111 of FIG. 14, or pre-amp 121 of FIG. 15. The resistor RF shown within the block of the pre-amp 171 represents the resistors RFM and RFP in any of the pre-amps 101, 111, and 121. A low-pass filter is formed by the resistor RF and the capacitor CL.

The first AGC circuit 176 is used to adjust the gain and frequency characteristics of the pre-amp 171. The first AGC circuit 176 has a structure identical to that of the AGC circuit 44 shown in FIG. 4, and generates a first gain control signal VAGC1 based the reference signal VRP of the main amp 174. The pre-amp 171 adjusts its frequency characteristics together with the resistance value of the resistor RF in accordance with the first gain control signal VAGC1. The first AGC circuit 136 also may have a structure identical to the AGC circuit 61 of FIG. 8, the AGC circuit 71 of FIG. 9, the AGC circuit 81 of FIG. 10, or the AGC circuit 91 of FIG. 12.

The second AGC circuit 177 is used to adjust the frequency characteristics of the bandpass filter 173. The second AGC circuit 177 generates a second gain control signal VAGC2 based on the reference signal VRP of the main amp 174. The bandpass filter 173 adjusts the frequency characteristics in accordance with the second gain control signal VAGC2. The second AGC circuit 177 also may be used to adjust the frequency characteristics of the main amp 174 or the comparator 175 rather than the bandpass filter 173.

When the resistance value of the resistor RF of the pre-amp 171 decreases, there is an increase in the cutoff frequency fL of the low-pass filter formed by the capacitor CL and the resistor RF. For example, when the resistance value of the resistor RF is ½, the cutoff frequency fL is doubled. Then, when the resistance value of the resistor RF becomes still smaller, the cutoff frequency of the low-pass filter is limited in accordance with the frequency characteristics of the pre-amp 171 itself. In the eighth embodiment, the cutoff frequency of the low-pass filter is shifted to the high frequency range when the optical signal is relatively large to obtain amplifier frequency characteristics suited for high-speed communications.

In modulation methods using a predetermined baseband frequency, the band range is restricted using a normal bandpass filter to improve noise resistance. For example, in infrared communications (IrDA communications), communication methods using a low speed of 115 Kbps (pulse width 1.63 us), and communication methods using a high speed of 1.152 Mbps (pulse width 217 ns) are stipulated based on the bandpass frequency and reception distance. At a low speed of 115 Kbps, the reception sensitivity must be 2.5 times the reception sensitivity at a high speed of 1.152 Mbps.

In these communication methods, the frequency characteristics in the eighth embodiment are pre-adjusted to match the low speed of 115 Kbps. Then, when the optical input signal is relatively large, the cutoff frequency of the low-pass filter of the pre-amp 171 is shifted to the high frequency range at the same time the gain of the pre-amp 171 is adjusted by the AGC circuit 176. In this way, amplifier frequency characteristics suited for high-speed communications at 1.152 Mbps are obtained. This frequency shift is accomplished when a high-speed communication mode is permitted by a gain smaller than the gain of the low-speed communication mode.

Since the cutoff frequency is set in the low frequency range in the low-speed communication mode necessary for high sensitivity, a large noise margin is obtained by the band restriction. When the optical signals are relatively large in the high-speed communication mode, the cutoff frequency is shifted to the high frequency range. In this case, a large noise margin is obtained because the gain is reduced by the AGC circuit 176.

Figure 21B:
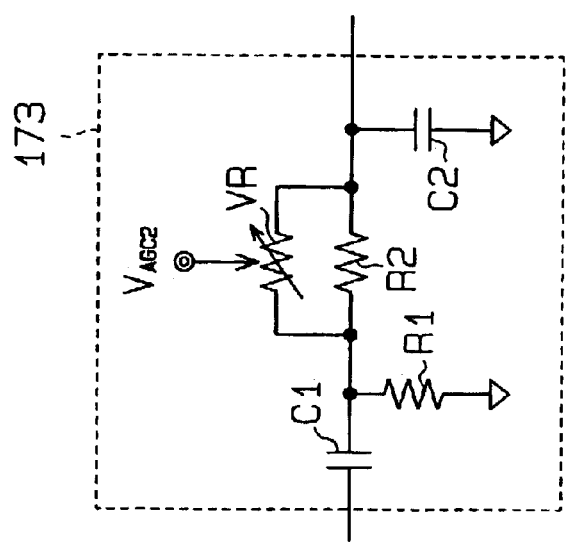
FIG. 21B is a circuit diagram of the bandpass filter in the optical receiver amp of FIG. 20.
Figure 21A:
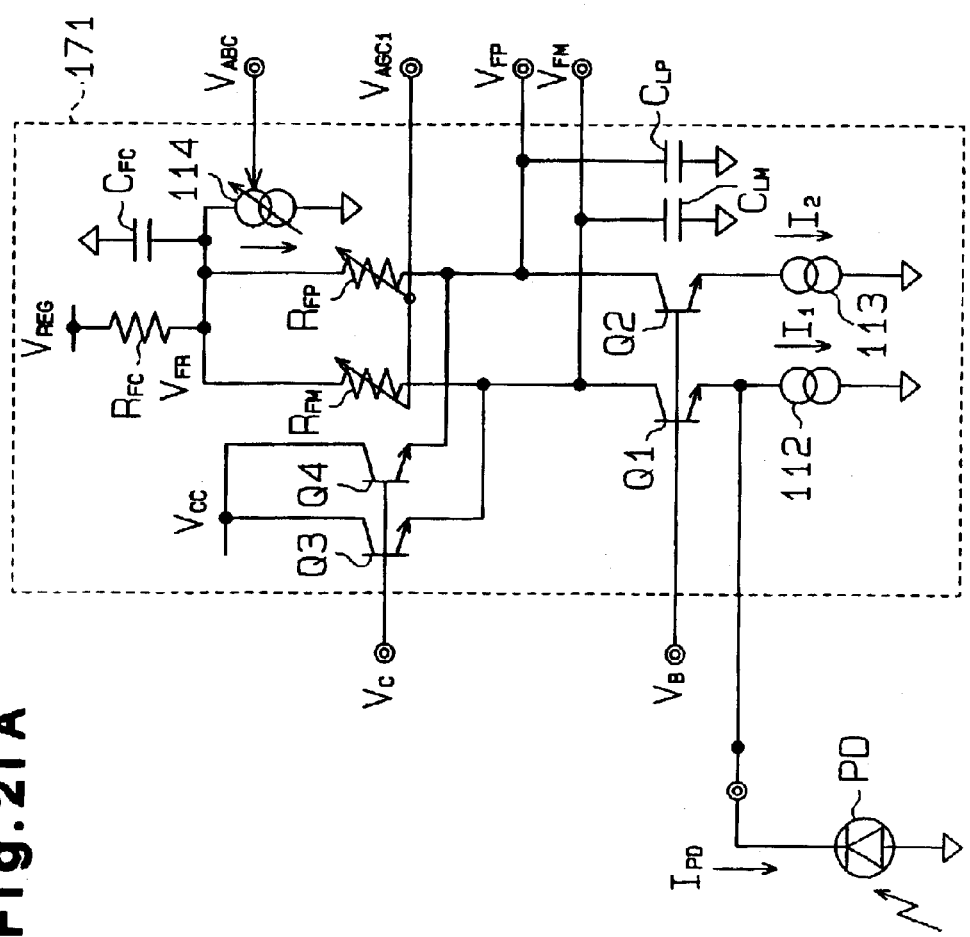
FIG. 21A is a circuit diagram of the pre-amp circuit in the optical receiver amp of FIG. 20.

The pre-amp 171 shown in FIG. 21A includes three resistors RFM, RFP, and RFC, four transistors Q1 through Q4, three current sources 112, 113, and 114, and three capacitors CFC, CLM, and CLP. The capacitor CLM is connected between a low-potential power supply and a node between the resistor RFM and the transistor Q1. The capacitor CLP is connected between a low-potential power supply and a node between the resistor RFP and the transistor Q2.

The bandpass filter 173 shown in FIG. 21B includes two capacitors C1 and C2, two resistors R1 and R2, and one variable resistance resistor VR. The capacitor C1 and the resistor R1 comprise a high-pass filter, and the capacitor C2 and resistor R2 comprise a low-pass filter. The high-pass filter and the low-pass filter are connected in series. The variable resistor VR is connected in parallel with the resistor R2. The resistance value of the variable resistor VR is adjusted by the second gain control signal VAGC2 to change the cutoff frequency of the low-pass filter, and thereby changing the center frequency fc of the bandpass filter 173.

The optical receiver amp 170 of the eighth embodiment provides the following advantages.

(1) A lo-pass filter is formed by the capacitor CL and the current-to-voltage conversion resistor RFM of the pre-amp 171. The first AGC circuit 176 changes the resistance value of the resistor RFM to adjust the gain of the pre-amp 171, and adjust the frequency characteristics of the low-pass filter. That is, when the gain of the pre-amp 171 decreases, the cutoff frequency of the low-pass filter shifts to the high frequency range.

(2) The frequency characteristics of the bandpass filter 173 are adjusted by the second AGC circuit 177.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. An amplification circuit for receiving an input current, the amplification circuit comprising:

a first amplifier including a current-to-voltage conversion resistor for generating a first voltage signal corresponding to the input current;

a second amplifier connected to the first amplifier for amplifying the first voltage signal and generating a second voltage signal;

a first gain control circuit connected to the first and second amplifiers for generating a first gain control signal based on the second voltage signal and adjusting the resistance value of the current-to-voltage conversion resistor in accordance with the first gain control signal; and a bias control circuit connected to the first amplifier and the first gain control circuit for generating a bias control signal based on the gain control signal and adjusting the bias current at the output of the first amplifier in accordance with the bias control signal.

2. The amplification circuit according to claim 1, wherein the current-to-voltage conversion resistor includes a variable resistance element having a resistance value which the variable resistance element changes in accordance with the first gain control signal.

3. The amplification circuit according to claim 1, wherein the first amplifier includes a current source connected in series with the current-to-voltage conversion resistor, for supplying a bias current to the current-to-voltage conversion resistor, and wherein the current source changes the bias current in accordance with the bias control signal.

4. The amplification circuit according to claim 1, wherein the first amplifier includes:

a current source connected in parallel with the current-to-voltage conversion resistor, for generating a current in accordance with the bias control signal, and a resistor connected between a high-potential power supply and a node between the current source and the current-to-voltage conversion resistor.

5. The amplification circuit according to claim 1, wherein the current source includes a variable current source for changing a current in accordance with the bias control signal.

6. The amplification circuit according to claim 1, wherein the first amplifier includes:
a transistor connected between a high-potential power supply and the current-to-voltage conversion resistor;
a resistor connected between the high-potential power supply and the control terminal of the transistor; and
a current source connected between a low-potential power supply and the control terminal for generating a current in accordance with the bias control signal.

7. The amplification circuit according to claim 6, wherein the transistor is one of a bipolar transistor and a MOS transistor.

8. The amplification circuit according to claim 6, wherein the current source includes a variable current source for changing the current in accordance with the bias control signal.

9. The amplification circuit according to claim 1, wherein the first amplifier includes a clamp circuit connected to the current-to-voltage conversion resistor for clamping the voltage of the first voltage signal at a predetermined voltage.

10. The amplification circuit according to claim 1, wherein the first gain control circuit includes:
a peak-hold circuit for maintaining a peak level of the second voltage signal to generate a peak-hold signal; and
an output circuit connected to the peak-hold circuit for amplifying the peak-hold signal to generate a first gain control signal, and wherein the output circuit includes:
a variable resistor connected to the current-to-voltage conversion resistor;
a first amplification unit connected to the peak-hold circuit and the variable resistor for supplying a first current corresponding to the peak-hold signal to the variable resistor;
another resistor connected to the variable resistor; and
a second amplification unit connected to the variable resistor and the another resistor and first amplification circuit, for generating a first gain control signal to substantially equalize the product of the resistance value of the resistor and the second current flowing through the resistor with the product of the resistance value of the variable resistor and the first current.

11. The amplification circuit according to claim 1, wherein the first gain control circuit includes:
a peak-hold circuit for maintaining the peak level of the second voltage signal to generate a peak-hold signal and;
an output circuit connected to the peak-hold circuit for amplifying the peak-hold signal to generate a first gain control signal; and
a reset circuit connected to the peak-hold circuit for resetting the peak-hold signal.

12. The amplification circuit according to claim 11, wherein the reset circuit includes a current output-type amplifier for receiving the peak-hold signal and a reference signal, and feeding back an output signal to the input of the amplifier.

13. The amplification circuit according to claim 1, wherein the first gain control circuit includes:
a peak-hold circuit for maintaining the peak level of the second voltage signal to generate a peak-hold signal;
an output circuit connected to the peak-hold circuit, for amplifying the peak-hold signal to generate a first gain control signal; and
a reset circuit connected to the peak-hold circuit, for resetting the peak-hold signal, wherein the output circuit includes:
an amplification unit connected to the peak-hold circuit for receiving the peak-hold signal and a reference signal and generating an amplified output signal;
another resistor connected in parallel with the current-to-voltage conversion resistor; and
a first current source connected to the another resistor and the amplification unit for generating a current corresponding to the amplified output signal, and wherein the reset circuit includes a second current source, which is connected between a low-potential power supply and the peak-hold circuit and is current-mirror connected to the first current source, for generating a current corresponding to the amplified output signal.

14. The amplification circuit according to claim 1, wherein the bias control circuit includes:
a variable resistor for changing the resistance value in accordance with the first gain control signal, wherein the variable resistor has electrical characteristics identical to the current-to-voltage conversion resistor;
a current source connected to the variable resistor;
another resistor connected to a high-potential power supply; and
an amplification unit connected to the variable resistor and another resistor and current source, for generating a signal as the bias control signal for adjusting the current flowing through the current source to substantially equalize the product of the resistance value of the resistor and a first current flowing through the resistor with the product of the resistance value of the variable resistor and a second current flowing through the variable resistor.

15. The amplification circuit according to claim 1, further comprising a second gain control circuit connected to the second amplifier for generating a second gain control signal based on the second voltage signal and adjusting the gain of the second amplifier in accordance with the second gain control signal.

16. The amplification circuit according to claim 15, wherein the second gain control circuit starts to operate after the gain adjustment by the first gain control circuit approaches a threshold limit.

17. The amplification circuit according to claim 1, further comprising a second gain control circuit connected to the first amplifier for generating a second gain control signal based on the first voltage signal and adjusting the bias current at the output of the first amplifier in accordance with the bias control signal and the second gain control signal.

18. The amplification circuit according to claim 1, further comprising
a bandpass filter connected between the first amplifier and the second amplifier; and
a second gain control circuit connected to the second amplifier and the bandpass filter for adjusting the frequency characteristics of the bandpass filter based on the second voltage signal.

19. The amplification circuit according to claim 18, wherein the first amplifier includes a capacitor connected to the current-to-voltage conversion resistor for forming a low-pass filter together with the current-to-voltage conversion resistor.

20. The amplification circuit according to claim 1, wherein the first amplifier includes a capacitor connected to the current-to-voltage conversion resistor, for forming a low-pass filter together with the current-to-voltage conversion resistor.

21. The amplification circuit according to claim 1, wherein the first amplifier generates a first voltage signal corresponding to a first reception current as the input current generated from signal light from a first photoreceptor element, and the amplification circuit further comprises:

a second photoreceptor element for receiving part of the signal light and generating a second reception current; and a second gain control circuit connected to the second photoreceptor element and the first amplifier for generating a second gain control signal based on the second reception current and adjusting gain of the first amplifier in accordance with the second gain control signal.

22. The amplification circuit according to claim 21, wherein the second photoreceptor element includes a diode formed on a semiconductor substrate forming the amplification circuit.

23. The amplification circuit according to claim 21, wherein the second photoreceptor element includes a light-emitting diode having a light emitting function and a photodetection function.

24. An optical communication apparatus for receiving signal light, the optical communication apparatus comprising:

a first photoreceptor element for receiving the signal light and generating a first reception current;

a first amplifier connected to the first photoreceptor element, including a current-to-voltage conversion resistor, wherein the first amplifier generates a first voltage signal corresponding to the first reception current;

a second amplifier connected to the first amplifier for amplifying the first voltage signal and generating a second voltage signal;

a first gain control circuit connected to the first and second amplifiers for generating a first gain control signal based on the second voltage signal and adjusting the resistance value of the current-to-voltage conversion resistor in accordance with the first gain control signal; and a bias control circuit connected to the first amplifier and the first gain control circuit for generating a bias control signal based on the gain control signal and adjusting the bias current at the output of the first amplifier in accordance with the bias control signal.

25. The optical communication apparatus according to claim 24, further comprising:

a second photoreceptor element for receiving part of the signal light and generating a second reception current; and a second gain control circuit connected to the second photoreceptor element and the first amplifier for generating a second gain control signal based on the second reception current and adjusting the gain of the first amplifier in accordance with the second gain control signal.

26. An optical communication apparatus comprising:

a transmission circuit for generating a transmission current in accordance with a transmission signal;

a light-emitting element for generating transmission signal light in accordance with the transmission current and generating a signal light detection signal;

a photoreceptor element for receiving a signal light and generating a reception current;

a reception circuit connected to the photoreceptor element for generating a reception signal corresponding to the reception current; and a switching circuit connected to the light-emitting element, the transmission circuit and the reception circuit, for connecting the light-emitting element and the transmission circuit in a transmission mode and connecting the light-emitting element and the reception circuit in a reception mode, the reception circuit including:

a first amplifier including a current-to-voltage conversion resistor for generating a first voltage signal corresponding to the reception current;

a second amplifier connected to the first amplifier for amplifying the first voltage signal and generating a second voltage signal;

a first gain control circuit connected to the first and second amplifiers for generating a first gain control signal based on the second voltage signal and adjusting the resistance value of the current-to-voltage conversion resistor in accordance with the first gain control signal;

a bias control circuit connected to the first amplifier and the first gain control circuit for generating a bias control signal based on the gain control signal and adjusting the current at the output of the first amplifier in accordance with the bias control signal; and a second gain control circuit connected to the light-emitting element and the first amplifier for generating a second gain control signal based on the detection signal and adjusting the gain of the first amplifier in accordance with the second gain control signal.

* * * * *